(12) United States Patent
Sato et al.

(10) Patent No.: US 12,538,727 B2
(45) Date of Patent: Jan. 27, 2026

(54) TREATMENT LIQUID FOR SEMICONDUCTOR WITH RUTHENIUM

(71) Applicant: TOKUYAMA CORPORATION, Yamaguchi (JP)

(72) Inventors: Tomoaki Sato, Yamaguchi (JP); Yuki Kikkawa, Yamaguchi (JP); Takafumi Shimoda, Yamaguchi (JP); Takayuki Negishi, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 228 days.

(21) Appl. No.: 17/801,964

(22) PCT Filed: Feb. 25, 2021

(86) PCT No.: PCT/JP2021/006986
§ 371 (c)(1),
(2) Date: Aug. 24, 2022

(87) PCT Pub. No.: WO2021/172397
PCT Pub. Date: Sep. 2, 2021

(65) Prior Publication Data
US 2023/0207329 A1    Jun. 29, 2023

(30) Foreign Application Priority Data

Feb. 25, 2020 (JP) ................. 2020-029907

(51) Int. Cl.
*H01L 21/32* (2006.01)
*H01L 21/3213* (2006.01)

(52) U.S. Cl.
CPC ............... *H01L 21/32134* (2013.01)

(58) Field of Classification Search
CPC ......... H01L 21/32134; H01L 21/02068; H01L 21/3212; C11D 2111/22; C11D 3/3956; C11D 3/042; C11D 3/168; C11D 3/3942; C11D 7/08; C11D 7/266; C23F 1/40; C09K 13/06
USPC ................. 438/745; 252/79.1–79.5
See application file for complete search history.

(56) References Cited

U.S. PATENT DOCUMENTS

| | | | |
|---|---|---|---|
| 2002/0060202 A1 | 5/2002 | Fukunaga et al. | |
| 2003/0207214 A1 | 11/2003 | Futase et al. | |
| 2005/0176603 A1* | 8/2005 | Hsu | G03F 7/426 |
| | | | 134/42 |
| 2012/0256122 A1* | 10/2012 | Sato | H01L 21/32134 |
| | | | 252/79.1 |
| 2013/0130500 A1 | 5/2013 | Sato et al. | |
| 2017/0222138 A1 | 8/2017 | Park et al. | |
| 2020/0211856 A1* | 7/2020 | Wada | C09K 13/08 |
| 2020/0354632 A1 | 11/2020 | Sugimura et al. | |
| 2021/0062115 A1 | 3/2021 | Shimoda et al. | |

FOREIGN PATENT DOCUMENTS

| | | |
|---|---|---|
| JP | 59-230197 | 12/1984 |
| JP | 3-48748 | 3/1991 |
| JP | 5-215895 | 8/1993 |
| JP | 9-72833 | 3/1997 |
| JP | 9-227129 | 9/1997 |
| JP | 2001-240985 | 9/2001 |
| JP | 2002-161381 | 6/2002 |
| JP | 2007-302938 | 11/2007 |
| JP | 2008-156654 | 7/2008 |
| JP | 2009-81247 | 4/2009 |
| JP | 2019-218436 | 12/2019 |
| KR | 10-2013-0060255 | 6/2013 |
| WO | 2009/017782 | 2/2009 |
| WO | 2011/074601 | 6/2011 |
| WO | 2016/068183 | 5/2016 |
| WO | 2019/142788 | 7/2019 |
| WO | 2019/150990 | 8/2019 |

OTHER PUBLICATIONS

Decision of Refusal issued Mar. 22, 2023 in corresponding Japanese Patent Application No. 2022-503672, with English language translation.
International Search Report issued May 11, 2021 in corresponding International (PCT) Patent Application No. PCT/JP2021/006986.
Office Action issued Aug. 9, 2022 in corresponding Japanese Patent Application No. 2022-503672, with English language translation.
Kosuke Izutsu, "Electrochemistry in Nonaqueous Solutions", Baifukan Co., Ltd., pp. 3-5, 1995, with English translation.
Korean Office Action dated Nov. 9, 2022 in corresponding Korean Patent Application No. 10-2022-7030598, with English machine translation.

* cited by examiner

*Primary Examiner* — Duy Vu N Deo
(74) *Attorney, Agent, or Firm* — Wenderoth, Lind & Ponack, L.L.P.

(57) ABSTRACT

Provided is a treatment liquid for a semiconductor with ruthenium including a ligand which coordinates to ruthenium, the treatment liquid is a treatment liquid for inhibiting a ruthenium-containing gas generated when contacting a semiconductor wafer including ruthenium with the treatment liquid in a semiconductor forming process. Also provided is an inhibitor for the generation of a ruthenium-containing gas, including a compound having a carbonyl group or a heterocyclic compound. Further provided is a treatment agent for a ruthenium-containing waste liquid, including a compound having a carbonyl group or a heterocyclic compound.

7 Claims, No Drawings

TREATMENT LIQUID FOR SEMICONDUCTOR WITH RUTHENIUM

TECHNICAL FIELD

The present invention relates to a novel treatment liquid for inhibiting a ruthenium-containing gas generated when contacting a semiconductor wafer including ruthenium with the treatment liquid in a semiconductor device manufacturing process.

BACKGROUND ART

In recent years, the miniaturization of semiconductor device design rules has progressed and wiring resistance tends to be increased. An increase in wiring resistance remarkably results in inhibition of high-speed operations of semiconductor devices, and measures are required to be taken. A desired wiring material is here a wiring material with electromigration resistance and decreased resistance value as compared with conventional wiring materials.

Ruthenium attracts attention particularly as a wiring material having a semiconductor device design rule of 10 nm or less because of being high in electromigration resistance and being capable of decreasing the wiring resistance value, as compared with aluminum and copper which are conventional wiring materials. Application of ruthenium not only to a wiring material but also to a barrier metal has been studied because ruthenium can prevent electromigration even in a case where copper is used as a wiring material.

Even in a case where ruthenium is selected as a wiring material, wiring is formed by dry or wet etching as in the case of conventional wiring materials, in a wiring formation process of semiconductor devices. However, ruthenium is difficult to remove by dry etching with an etching gas or etching according to CMP polishing and thus is desirably etched more precisely, and specifically wet etching attracts attention.

In a case where ruthenium is wet etched under an alkaline condition, ruthenium is, for example, dissolved as $RuO_4^-$ or $RuO_4^{2-}$ in a treatment liquid. $RuO_4^-$ or $RuO_4^{2-}$ is changed into $RuO_4$ in the treatment liquid, and $RuO_4$ is partially gasified and released into a gas phase. $RuO_4$ is highly oxidizing and thus not only is harmful to humans, but also is easily reduced to generate $RuO_2$ particles (particles of $RuO_2$). In general, $RuO_2$ particles cause a decrease in yield, and thus are very problematic in a semiconductor forming process. It is very important in view of such circumstances to inhibit generation of a $RuO_4$ gas.

Patent Document 1 discloses a chemical liquid having a pH of 12 or more and having an oxidation-reduction potential of 300 mV vs. SHE or more, as an etching liquid for a ruthenium film. Furthermore, the Document presents a method for etching a ruthenium film with a solution of an oxyacid salt of halogen, such as hypochlorite, chlorite or bromate.

Patent Document 2 proposes a method involving oxidizing, dissolving, and removing ruthenium with an aqueous solution including orthoperiodic acid and having a pH of 11 or more.

Patent Document 3 indicates a CMP slurry including a ruthenium-coordinated nitric oxide ligand (N—O ligand) not generating any $RuO_4$ gas in chemical mechanical polishing (CMP) of ruthenium.

RELATED ART DOCUMENT

Patent Document

Patent Document 1: Japanese Patent Application Publication No. 2002-161381
Patent Document 2: International Publication No. WO 2016/068183
Patent Document 3: International Publication No. WO 2009/017782

Non Patent Document

Non-Patent Document 1: Kosuke Izutsu, "Electrochemistry in Nonaqueous Solutions", Baifukan Co., Ltd., 1995, p. 3

SUMMARY OF THE INVENTION

Problems to be Solved by the Invention

However, it has found according to studies by the present inventors that conventional treatment liquids described in the prior art documents have room for improvement in terms of the following.

For example, the method for etching ruthenium described in Patent Document 1 is for the purpose of removal of any ruthenium residue attached on the backside and/or bevel of a semiconductor substrate, and can allow for dissolution and removal of ruthenium. However, Patent Document 1 does not mention any inhibition of a $RuO_4$ gas, and $RuO_4$ gas generation cannot be actually inhibited by the method described in Patent Document 1.

Patent Document 2 discloses a composition for removal of ruthenium, including orthoperiodic acid, and indicates that an etching residue including ruthenium can be etched. However, Patent Document 2 does not mention any inhibition of a $RuO_4$ gas, and a $RuO_4$ gas cannot be inhibited from being generated during etching process.

Additionally, Patent Document 3 indicates that the CMP slurry including a ruthenium-coordinated nitric oxide ligand (N—O ligand) can be used in CMP to thereby inhibit a toxic $RuO_4$ gas. However, the CMP slurry indicated in Patent Document 3 is acidic, and it is difficult under an alkaline condition, which is different in dissolution mechanism of ruthenium, to inhibit a $RuO_4$ gas by the composition of the CMP slurry indicated in Patent Document 3. It has been actually confirmed that, when the ruthenium-coordinated nitric oxide ligand described in Patent Document 3 is added to an alkaline ruthenium etching liquid including hypochlorous acid, a $RuO_4$ gas is generated and no effect of inhibiting a $RuO_4$ gas is exerted.

Accordingly, an object of the present invention is to provide a treatment liquid for a semiconductor wafer, which can inhibit generation of a $RuO_4$ gas when contacting a semiconductor wafer including ruthenium and the treatment liquid under an alkaline condition.

Means for Solving the Problems

The present inventors have intensively studied in order to solve the above problems. The inventors have made studies about addition of various ligands to a treatment liquid for a semiconductor wafer including ruthenium. The inventors have combined various additive components because a $RuO_4$ gas cannot be inhibited simply with only a treatment liquid for a semiconductor wafer including ruthenium. As a result, the inventors have found that $RuO_4$ gas generation can be inhibited by addition of a specific ligand, and completed the present invention.

In other words, the configuration of the present invention is as follows.

Aspect 1 A treatment liquid for a semiconductor with ruthenium, including a ligand which coordinates to ruthenium.

Aspect 2 The treatment liquid for a semiconductor with ruthenium according to Aspect 1, wherein the ligand which coordinates to ruthenium is a compound having a carbonyl group.

Aspect 3 The treatment liquid for a semiconductor with ruthenium according to Aspect 1, wherein the ligand which coordinates to ruthenium is a heterocyclic compound containing nitrogen.

Aspect 4 The treatment liquid for a semiconductor with ruthenium according to Aspect 1 or 2, wherein the ligand which coordinates to ruthenium is at least one selected from the group consisting of ligands represented by the following formulae (1) to (4):

(1)

wherein $R_1$ and $R_2$ are each independently a hydrocarbon group having carbon number of 1 to 10, optionally containing a hydroxyl group or/and an ether bond, or a hydroxyl group;

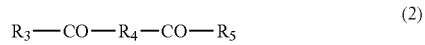

(2)

wherein $R_3$ and $R_5$ are each independently a hydrocarbon group having carbon number of 1 to 10, optionally containing a hydroxyl group or/and an ether bond, or a hydroxyl group, and $R_4$ is a hydrocarbon group having carbon number of 1 to 10, optionally containing a hydroxyl group or/and an ether bond;

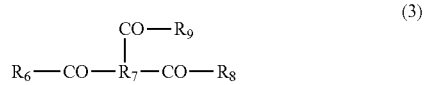

(3)

wherein $R_6$, $R_8$, and $R_9$ are each independently a hydrocarbon group having carbon number of 1 to 10, optionally containing a hydroxyl group or/and an ether bond, or a hydroxyl group, and $R_7$ is a hydrocarbon group having carbon number of 1 to 10, optionally containing a hydroxyl group or/and an ether bond;

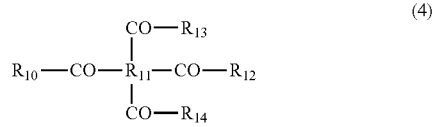

(4)

wherein $R_{10}$ and $R_{12\ to\ 14}$ are each independently a hydrocarbon group having carbon number of 1 to 10, optionally containing a hydroxyl group or/and an ether bond, or a hydroxyl group, and $R_{11}$ is a hydrocarbon group having carbon number of 1 to 10, optionally containing a hydroxyl group or/and an ether bond.

Aspect 5 The treatment liquid for a semiconductor with ruthenium according to Aspect 1 or 2, wherein the ligand which coordinates to ruthenium is a ligand represented by the following formula (5)

(5)

wherein $R_{15}$ and $R_{16}$ are each independently a hydrocarbon group having carbon number of 1 to 10, optionally containing a hydroxyl group or/and an ether bond, or a hydroxyl group.

Aspect 6 The treatment liquid for a semiconductor with ruthenium according to Aspect 4 or 5, wherein the compound having a carbonyl group is oxalic acid, dimethyl oxalate, 1,2,3,4,5,6-cyclohexanehexacarboxylic acid, succinic acid, acetic acid, butane-1,2,3,4-tetracarboxylic acid, dimethylmalonic acid, glutaric acid, diglycolic acid, citric acid, malonic acid, 1,3-adamantane dicarboxylic acid, or 2,2-bis(hydroxymethyl)propionic acid.

Aspect 7 The treatment liquid for a semiconductor with ruthenium according to Aspect 3, wherein the heterocyclic compound containing nitrogen is a pyridine compound, a piperazine compound, a triazole compound, a pyrazole compound, or an imidazole compound.

Aspect 8 The treatment liquid for a semiconductor with ruthenium according to any one of Aspects 1 to 7, having a pH at 25° C. of 7 or more and 14 or less.

Aspect 9 The treatment liquid for a semiconductor with ruthenium according to any one of Aspects 1 to 8, wherein the concentration of the ligand which coordinates to ruthenium is 0.0001 to 60% by mass.

Aspect 10 The treatment liquid for a semiconductor with ruthenium according to any one of Aspects 1 to 9, wherein the treatment liquid includes an oxidant.

Aspect 11 The treatment liquid for a semiconductor with ruthenium according to Aspect 10, wherein the oxidant is a hypochlorite ion and the concentration of the hypochlorite ion is 0.05 to 20.0% by mass.

Aspect 12 The treatment liquid for a semiconductor with ruthenium according to Aspect 10, wherein the oxidant is a hypobromite ion and the concentration of the hypobromite ion is 0.01 to 1.9% by mass.

Aspect 13 The treatment liquid for a semiconductor with ruthenium according to Aspect 10, wherein the oxidant is a hypobromite ion and the concentration of the hypobromite ion is 0.012 to 1.9% by mass.

Aspect 14 The treatment liquid for a semiconductor with ruthenium according to Aspect 10, wherein the oxidant includes a hypochlorite ion and a hypobromite ion, and the concentration of the hypochlorite ion is 0.05 to 20.0% by mass and the concentration of the hypobromite ion is 0.01 to 1.9% by mass.

Aspect 15 The treatment liquid for a semiconductor with ruthenium according to Aspect 10, wherein the oxidant is orthoperiodic acid or metaperiodic acid.

Aspect 16 A method for treating a ruthenium-containing wafer with the treatment liquid according to any one of Aspects 1 to 15.

Aspect 17 An inhibitor for the generation of a ruthenium-containing gas, including a ligand which coordinates to ruthenium.

Aspect 18 The inhibitor for the generation of a ruthenium-containing gas according to Aspect 17, wherein the ligand which coordinates to ruthenium is a compound having a carbonyl group.

Aspect 19 The inhibitor for the generation of a ruthenium-containing gas according to Aspect 17, wherein the ligand which coordinates to ruthenium is a heterocyclic compound containing nitrogen.

Aspect 20 The inhibitor for the generation of a ruthenium-containing gas according to Aspect 18, wherein the compound having a carbonyl group is at least one selected from the group consisting of compounds represented by the following formulae (1) to (4):

(1)

wherein $R_1$ and $R_2$ are each independently a hydrocarbon group having carbon number of 1 to 10, optionally containing a hydroxyl group or/and an ether bond, or a hydroxyl group;

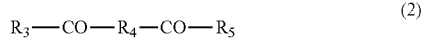
(2)

wherein $R_3$ and $R_5$ are each independently a hydrocarbon group having carbon number of 1 to 10, optionally containing a hydroxyl group or/and an ether bond, or a hydroxyl group, and Ra is a hydrocarbon group having carbon number of 1 to 10, optionally containing a hydroxyl group or/and an ether bond;

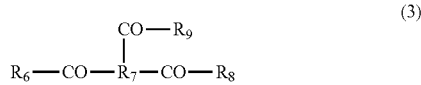
(3)

wherein $R_6$, $R_8$, and $R_9$ are each independently a hydrocarbon group having carbon number of 1 to 10, optionally containing a hydroxyl group or/and an ether bond, or a hydroxyl group, and $R_7$ is a hydrocarbon group having carbon number of 1 to 10, optionally containing a hydroxyl group or/and an ether bond;

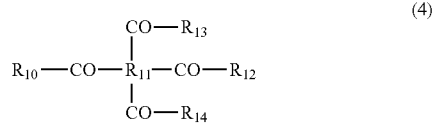
(4)

wherein $R_{10}$ and $R_{12\ to\ 14}$ are each independently a hydrocarbon group having carbon number of 1 to 10, optionally containing a hydroxyl group or/and an ether bond, or a hydroxyl group, and $R_{11}$ is a hydrocarbon group having carbon number of 1 to 10, optionally containing a hydroxyl group or/and an ether bond.

Aspect 21 The inhibitor for the generation of a ruthenium-containing gas according to Aspect 18, wherein the compound having a carbonyl group is a compound represented by the following formula (5):

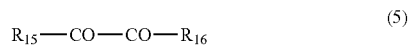
(5)

wherein $R_{15}$ and $R_{16}$ are each independently a hydrocarbon group having carbon number of 1 to 10, optionally containing a hydroxyl group or/and an ether bond, or a hydroxyl group.

Aspect 22 The inhibitor for the generation of a ruthenium-containing gas according to Aspect 20 or 21, wherein the compound having a carbonyl group is oxalic acid, dimethyl oxalate, 1,2,3,4,5,6-cyclohexanehexacarboxylic acid, succinic acid, acetic acid, butane-1,2,3,4-tetracarboxylic acid, dimethylmalonic acid, glutaric acid, diglycolic acid, citric acid, malonic acid, 1,3-adamantane dicarboxylic acid, or 2,2-bis(hydroxymethyl)propionic acid.

Aspect 23 The inhibitor for the generation of a ruthenium-containing gas according to Aspect 19, wherein the heterocyclic compound containing nitrogen is a pyridine compound, a piperazine compound, a triazole compound, a pyrazole compound, or an imidazole compound.

Aspect 24 The inhibitor for the generation of a ruthenium-containing gas according to any one of Aspects 17 to 23, having a pH at 25° C. of 7 or more and 14 or less.

Aspect 25 The inhibitor for the generation of a ruthenium-containing gas according to any one of Aspects 17 to 24, wherein the concentration of the ligand which coordinates to ruthenium is 0.0001 to 60% by mass.

Aspect 26 The inhibitor for the generation of a ruthenium-containing gas according to any one of Aspects 17 to 25, further including an oxidant.

Aspect 27 The inhibitor for the generation of a ruthenium-containing gas according to Aspect 26, wherein the oxidant is a hypochlorite ion and the concentration of the hypochlorite ion is 0.05 to 20.0% by mass.

Aspect 28 The inhibitor for the generation of a ruthenium-containing gas according to Aspect 26, wherein the oxidant is a hypobromite ion and the concentration of the hypobromite ion is 0.01 to 1.9% by mass.

Aspect 29 The inhibitor for the generation of a ruthenium-containing gas according to Aspect 26, wherein the oxidant includes a hypochlorite ion and a hypobromite ion, and the concentration of the hypochlorite ion is 0.05 to 20.0% by mass and the concentration of the hypobromite ion is 0.01 to 1.9% by mass.

Aspect 30 The inhibitor for the generation of a ruthenium-containing gas according to Aspect 26, wherein the oxidant is orthoperiodic acid or metaperiodic acid.

Aspect 31 Use of the inhibitor for the generation of a ruthenium-containing gas according to any one of Aspects 17 to 30.

Aspect 32 A treatment agent for a ruthenium-containing waste liquid, including a ligand which coordinates to ruthenium.

Aspect 33 The treatment agent for a ruthenium-containing waste liquid according to Aspect 32, wherein the ligand which coordinates to ruthenium is a compound having a carbonyl group.

Aspect 34 The treatment agent for a ruthenium-containing waste liquid according to Aspect 32, wherein the ligand which coordinates to ruthenium is a heterocyclic compound containing nitrogen.

Aspect 35 The treatment agent for a ruthenium-containing waste liquid according to Aspect 33, wherein the compound having a carbonyl group is at least one selected from the group consisting of compounds represented by the following formulae (1) to (4):

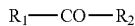
(1)

wherein $R_1$ and $R_2$ are each independently a hydrocarbon group having carbon number of 1 to 10, optionally containing a hydroxyl group or/and an ether bond, or a hydroxyl group;

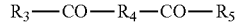
(2)

wherein $R_3$ and $R_5$ are each independently a hydrocarbon group having carbon number of 1 to 10, optionally containing a hydroxyl group or/and an ether bond, or a hydroxyl group, and $R_4$ is a hydrocarbon group having carbon number of 1 to 10, optionally containing a hydroxyl group or/and an ether bond;

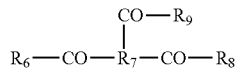
(3)

wherein $R_6$, $R_8$, and $R_9$ are each independently a hydrocarbon group having carbon number of 1 to 10, optionally containing a hydroxyl group or/and an ether bond, or a hydroxyl group, and $R_7$ is a hydrocarbon group having carbon number of 1 to 10, optionally containing a hydroxyl group or/and an ether bond;

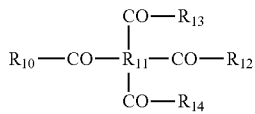
(4)

wherein $R_{10}$ and $R_{12\ to\ 14}$ are each independently a hydrocarbon group having carbon number of 1 to 10, optionally containing a hydroxyl group or/and an ether bond, or a hydroxyl group, and $R_{11}$ is a hydrocarbon group having carbon number of 1 to 10, optionally containing a hydroxyl group or/and an ether bond.

Aspect 36 The treatment agent for a ruthenium-containing waste liquid according to Aspect 33, wherein the compound having a carbonyl group is a compound represented by the following formula (5):

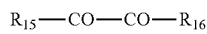
(5)

wherein $R_{15}$ and $R_{16}$ are each independently a hydrocarbon group having carbon number of 1 to 10, optionally containing a hydroxyl group or/and an ether bond, or a hydroxyl group.

Aspect 37 The treatment agent for a ruthenium-containing waste liquid according to any one of Aspects 32 to 36, wherein the concentration of the ligand which coordinates to ruthenium is 0.0001 to 60% by mass.

Aspect 38 A method for treating a ruthenium-containing waste liquid with the treatment agent according to any one of Aspects 32 to 37.

Effect of the Invention

According to the treatment liquid of the present invention, generation of a ruthenium-containing gas causing $RuO_2$ particles and a decrease in yield in a semiconductor manufacturing process can be inhibited by the effect of the ligand which coordinates to ruthenium.

MODE FOR CARRYING OUT THE INVENTION (Ligand)

The ligand is added in order to trap a ruthenium-containing compound ($RuO_4$ or the like) produced by dissolution of ruthenium, and encompasses a compound containing a hetero atom such as a nitrogen, oxygen, sulfur or phosphorus atom, more specifically, for example, a compound having an amino group, a phosphino group, a carboxyl group, a carbonyl group or a thiol group, or a heterocyclic compound containing nitrogen. Among such ligands, a compound having a carboxyl group or a carbonyl group, or a heterocyclic compound containing nitrogen, which have high resistance to an oxidant described below, can be suitably used as the ligand included in the treatment liquid for a semiconductor with ruthenium, the inhibitor for the generation of a ruthenium-containing gas, and/or the treatment agent for a ruthenium-containing waste liquid. The "semiconductor with ruthenium" means a semiconductor including ruthenium. While various types of ligands which coordinate to ruthenium (Ru) are generally known, the "ligand which coordinates to ruthenium" herein refers to a ligand which coordinates to a ruthenium-containing compound ($RuO_4$ or the like), as described below. In other words, a ligand which does not coordinate to any ruthenium-containing compound is not encompassed in the "ligand which coordinates to ruthenium" in the present invention. For example, a chloride ion ($Cl^-$) or a nitrate ion ($NO_3^-$) is known as a ligand which is taken with ruthenium (Ru) to thereby form a coordination complex. However, such a ligand, although coordinates to ruthenium (Ru), does not coordinate to any ruthenium-containing compound ($RuO_4$ or the like), and thus is not encompassed in the "ligand which coordinates to ruthenium" in the present invention. While the reason for this is not necessarily clear, it is presumed that a bond of Ru—O is strong and a substitution reaction of oxygen (O) of $RuO_4$ with a ligand ($Cl^-$, $NO_3^-$) slowly occurs, or a bond of Ru—O is strong and no appropriate spatial configuration can be taken (no coordination can be made due to steric restriction). Accordingly, it is important to select an appropriate ligand as the ligand which coordinates to ruthenium, namely, a ligand which coordinates to a ruthenium-containing compound ($RuO_4$ or the like).

A mechanism for inhibiting generation of a $RuO_4$ gas by the ligand which coordinates to ruthenium in the present invention is presumed as follows. Namely, in a case where ruthenium is dissolved in an alkaline solution, ruthenium is present as an ion such as $RuO_4^-$ or $RuO_4^{2-}$, or a neutral molecule such as $RuO_4$ or $RuO_2$ (ruthenium-containing compound; such a chemical species (ionic or neutral molecule) may also be referred to as "$RuO_4$ or the like"). $RuO_4^-$, $RuO_4^{2-}$, and $RuO_2$ are each changed into $RuO_4$ in the solution, and partially or fully released as a $RuO_4$ gas into a gas phase. Hereinafter, the mechanism for inhibiting $RuO_4$ gas generation will be described with, as an example, $RuO_4$ dissolved in the solution. Ruthenium in $RuO_4$ is present in the state of a positively biased charge due to the difference in electronegativity between ruthenium/oxygen. It is considered that a lone pair of N, P, O or S in an amino group, a phosphino group, a carboxyl group, a carbonyl group, or a thiol group included in the ligand which coordinates to ruthenium in the present invention coordinates to such positively charged ruthenium. It is considered that, in a case where the ligand is a heterocyclic compound containing nitrogen, a lone pair of N in the heterocyclic compound containing nitrogen coordinates to such positively charged ruthenium. It is also considered that, in a case where a hetero atom besides N is included in the heterocyclic compound containing nitrogen, a lone pair of P, O or S further coordinates to such positively charged ruthenium.

It is considered that the following gas inhibition mechanism is also exhibited in case of a carbonyl group or carboxyl group having a C=O bond and thus the effect of inhibiting gas is particularly high. $RuO_4$ is generally known as a strongly electrophilic metal oxide because ruthenium constituting $RuO_4$ has high electronegativity among metals. It is considered that such a strongly electrophilic metal oxide easily coordinates to unsaturated bond carbon and thus $RuO_4$ coordinates to a compound containing a carbonyl group having an unsaturated bond. It is considered that, in a case where the ligand is a heterocyclic compound containing nitrogen, $RuO_4$ coordinates to a heterocyclic ring or a hetero atom in the heterocyclic compound containing nitrogen.

Thus, there are cases where a ligand coordinates to $RuO_4$ or the like and a ligand is reversely coordinated to $RuO_4$ or the like, and both are inclusively defined as "ligand which coordinates to ruthenium". Examples of the solution in which ruthenium is dissolved include the treatment liquid for a semiconductor with ruthenium, the inhibitor for the generation of a ruthenium-containing gas or the treatment agent for a ruthenium-containing waste liquid of the present invention, in which ruthenium is dissolved. (The treatment liquid for a semiconductor with ruthenium, the inhibitor for the generation of a ruthenium-containing gas, and the treatment agent for a ruthenium-containing waste liquid may also be collectively referred to as "treatment liquid or the like".)

The foregoing mechanism allows a compound in which $RuO_4$ or the like and the ligand are linked (hereinafter, sometimes referred to as "ruthenium-coordinated product") to be formed in the treatment liquid or the like. $RuO_4$ or the like becomes thus a larger chemical species and also the ligand, which has polarity, coordinates to $RuO_4$, which is a non-polar molecule, and it is thus considered that $RuO_4$ or the like can be stably present in the treatment liquid or the like. $RuO_4$ or the like is thus inhibited from being gasified and therefore the amount of generation of a $RuO_4$ gas is decreased. Furthermore, it is presumed that production of $RuO_4$ is prevented and thus generation of $RuO_2$ particles due to reduction of $RuO_4$ is also inhibited.

For the above reasons, the ligand may contain a lone pair in order to inhibit generation of a $RuO_4$ gas, and, in particular, in a case where the ligand contains a carbonyl group or a carboxyl group or the ligand is a heterocyclic compound containing nitrogen, the effect of inhibiting gas is particularly high as described above regarding the mechanism. It is herein important according to the gas inhibition mechanism to contain a carbonyl group (C=O bond), and a carboxyl group contains a carbonyl group and thus the word "carbonyl group" herein also encompasses a C=O bond in a carboxyl group. A compound containing a carbonyl group is, in particular, preferably at least one selected from the group consisting of ketone, carboxylic acid, ester, amide, enone, acid chloride, acid anhydride, and the like, each having a high stability to an oxidant.

In a case where the ligand is a compound containing a carbonyl group, the compound is preferably at least one selected from the group consisting of compounds represented by formulae (1) to (5).

(1)

$R_1$ and $R_2$ are each independently a hydrocarbon group having carbon number of 1 to 10, optionally containing a hydroxyl group or/and an ether bond, or a hydroxyl group.

(2)

$R_3$ and $R_5$ are each independently a hydrocarbon group having carbon number of 1 to 10, optionally containing a hydroxyl group or/and an ether bond, or a hydroxyl group, and $R_4$ is a hydrocarbon group having carbon number of 1 to 10, optionally containing a hydroxyl group or/and an ether bond.

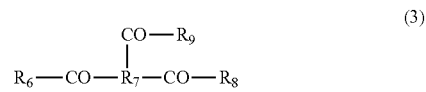

(3)

$R_6$, $R_8$, and $R_9$ are each independently a hydrocarbon group having carbon number of 1 to 10, optionally containing a hydroxyl group or/and an ether bond, or a hydroxyl group, and $R_7$ is a hydrocarbon group having carbon number of 1 to 10, optionally containing a hydroxyl group or/and an ether bond.

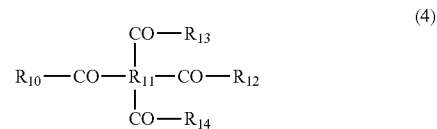

(4)

$R_{10}$ and $R_{12\ to\ 14}$ are each independently a hydrocarbon group having carbon number of 1 to 10, optionally containing a hydroxyl group or/and an ether bond, or a hydroxyl group, and $R_{11}$ is a hydrocarbon group having carbon number of 1 to 10, optionally containing a hydroxyl group or/and an ether bond.

(5)

$R_{15}$ and $R_{16}$ are each independently a hydrocarbon group having carbon number of 1 to 10, optionally containing a hydroxyl group or/and an ether bond, or a hydroxyl group.

The ligand having the above structure can be stably present in an alkaline treatment liquid or the like. The carbon number of $R_{1\ to\ 16}$ and the presence of a hydroxyl group or/and an ether bond in the formulae (1) to (5) can be appropriately selected to control the solubility of the ligand in the treatment liquid or the like and stability of a compound including the ligand and $RuO_4$ or the like.

For example, if the carbon number of the hydrocarbon group of the ligand is large, the molecular weight is increased and thus the solubility of the ligand in the treatment liquid or the like is decreased. If the solubility is decreased, the concentration of the ligand included in the treatment liquid or the like is decreased and thus the effect of inhibiting a $RuO_4$ gas is also deteriorated. For this reason, the carbon number of $R_{1\ to\ 16}$ is preferably 10 or less, more preferably 5 or less in order to keep the solubility necessary for effective gas inhibition.

Because O having a lone pair coordinates to ruthenium in $RuO_4$, as described in the above $RuO_4$ gas inhibition mechanism, $R_{1\ to\ 16}$ in the formulae (1) to (5) preferably contains a hydroxyl group or/and an ether bond.

Examples of the ligand suitably usable in the present invention can include, preferably amines such as triethanolamine, nitrilotriacetic acid, ethylenediaminetetraacetic acid and glycine, thiols such as cysteine and methionine, phosphines such as tributylphosphine and tetramethylenebis(diphenylphosphine), monocarboxylic acids such as acetic acid, formic acid, lactic acid, glycolic acid, 2,2-bis(hydroxymethyl)propionic acid, gluconic acid, α-glucoheptonic acid, heptynoic acid, phenylacetic acid, phenylglycolic acid, benzilic acid, gallic acid, cinnamic acid, naphthoic acid, anisic acid, salicylic acid, cresotic acid, acrylic acid and benzoic acid, or esters thereof, dicarboxylic acids such as malic acid, adipic acid, succinic acid, maleic acid, tartaric acid, oxalic acid, dimethyl oxalate, glutaric acid, malonic acid, 1,3-adamantane dicarboxylic acid, diglycolic acid and phthalic acid, or esters thereof, tricarboxylic acids typified by citric acid, or esters thereof, tetracarboxylic acids typified by butane-1,2,3,4-tetracarboxylic acid, or esters thereof, hexacarboxylic acids typified by 1,2,3,4,5,6-cyclohexanehexacarboxylic acid, or esters thereof, and carbonyl compounds such as ethyl acetoacetate and dimethylmalonic acid, more preferably monocarboxylic acids such as acetic acid, formic acid, lactic acid, glycolic acid, 2,2-bis(hydroxymethyl)propionic acid, gluconic acid, α-glucoheptonic acid, heptynoic acid, phenylacetic acid, phenylglycolic acid, benzilic acid, gallic acid, cinnamic acid, naphthoic acid, anisic acid, salicylic acid, cresotic acid, acrylic acid and benzoic acid, or esters thereof, dicarboxylic acids such as malic acid, adipic acid, succinic acid, maleic acid, tartaric acid, oxalic acid, dimethyl oxalate, glutaric acid, malonic acid, 1,3-adamantane dicarboxylic acid and diglycolic acid, or esters thereof, tricarboxylic acids typified by citric acid, or esters thereof, tetracarboxylic acids typified by butane-1,2,3,4-tetracarboxylic acid, or esters thereof, hexacarboxylic acids typified by 1,2,3,4,5,6-cyclohexanehexacarboxylic acid, or esters thereof, and carbonyl compounds such as ethyl acetoacetate and dimethylmalonic acid, further preferably oxalic acid, dimethyl oxalate, 1,2,3,4,5,6-cyclohexanehexacarboxylic acid, succinic acid, acetic acid, butane-1,2,3,4-tetracarboxylic acid, dimethylmalonic acid, glutaric acid, diglycolic acid, citric acid, malonic acid, 1,3-adamantane dicarboxylic acid, or 2,2-bis(hydroxymethyl)propionic acid.

The ligand usable in the present invention may be any ligand which can form the ruthenium-coordinated product, and, in a case where an isomer is present, the ligand is not limited thereto. For example, while there are a D-form and an L-form of lactic acid, the ligand is not limited by the difference between such isomers. Coordination to $RuO_4$ or the like or reverse coordination to $RuO_4$ or the like may be monodentate coordination or may be multidentate coordination as in a chelate. In such a case, one molecule or multiple molecules of the ligand may coordinate to one molecule of $RuO_4$ or the like.

The heterocyclic compound containing nitrogen in the present invention refers to a compound having a heterocyclic ring containing at least one nitrogen atom. The heterocyclic compound containing nitrogen, usable as the ligand in the present invention, can be preferably, for example, a piperidine compound, a pyridine compound, a piperazine compound, a pyridazine compound, a pyrimidine compound, a pyrazine compound, a 1,2,4-triazine compound, a 1,3,5-triazine compound, an oxazine compound, a thiazine compound, a cytosine compound, a thymine compound, a uracil compound, a pyrrolidine compound, a pyrroline compound, a pyrrole compound, a pyrazolidine compound, an imidazolidine compound, an imidazoline compound, a pyrazole compound, an imidazole compound, a triazole compound, a tetrazole compound, an oxazole compound, a thiazole compound, an oxadiazole compound, a thiadiazole compound, a thiazolidinedione compound, a succinimide compound, an oxazolidone compound, a hydantoin compound, an indoline compound, an indole compound, an indolizine compound, an indazole compound, an imidazole compound, an azaindazole compound, an indole compound, a purine compound, a benzoisoxazole compound, a benzoisothiazole compound, a benzoxazole compound, a benzothiazole compound, an adenine compound, a guanine compound, a carbazole compound, a quinoline compound, a quinolizine compound, a quinoxaline compound, a phthalazine compound, a quinazoline compound, a cinnoline compound, a naphthyridine compound, a pyrimidine compound, a pyrazine compound, a pteridine compound, an oxazine compound, a quinolinone compound, an acridine compound, a phenazine compound, a phenoxazine compound, a phenothiazine compound, a phenoxathiin compound, a quinuclidine compound, an azaadamantane compound, an azepine compound, or a diazepine compound, and can be more preferably, for example, a pyridine compound, a piperazine compound, a triazole compound such as benzotriazole, a pyrazole compound, or an imidazole compound, but is not limited thereto. In a case where any isomer of the heterocyclic compound containing nitrogen is present, such any isomer is not distinguished and can be used as the ligand in the present invention. For example, in a case where the heterocyclic compound containing nitrogen is an indole compound, the compound may be 1H-indole, 2H-indole or 3H-indole, or a mixture thereof. The heterocyclic compound containing nitrogen may be modified with any functional group, or may have a structure where a plurality of rings are fused. The heterocyclic compound containing nitrogen may be used singly or in combination of a plurality thereof. The heterocyclic compound containing nitrogen and any ligand which coordinates to ruthenium, other than the heterocyclic compound containing nitrogen, can be used in combination as the ligand in the present invention.

In a case where the ligand which coordinates to ruthenium in the present invention is the heterocyclic compound containing nitrogen, it is considered that gasification of $RuO_4$ or the like is inhibited and the amount of generation of a $RuO_4$ gas is decreased due to coordination of a lone pair of N in the heterocyclic compound containing nitrogen to positively charged ruthenium or coordination of $RuO_4$ to a heterocyclic ring or a hetero atom of the heterocyclic compound containing nitrogen, according to the above mechanism. It is presumed that furthermore production of $RuO_4$ is prevented and thus generation of $RuO_2$ particles due to reduction of $RuO_4$ is also inhibited.

In a case where the ligand in the present invention is included in a treatment liquid and a liquid for treating ruthenium, described below (hereinafter, also collectively referred to as "treatment liquid for a semiconductor with ruthenium"), the exerted effects are, for example, not only inhibition of a $RuO_4$ gas, but also an enhancement in stability of the treatment liquid for a semiconductor with ruthenium. The ligand in the present invention also has the ability to coordinate to other metal than ruthenium. In other words, the ligand can coordinate to a metal included as an impurity in a trace amount in the treatment liquid for a semiconductor with ruthenium, to thereby inhibit deterioration in stability of the treatment liquid, caused by such a metal impurity. In a case where an oxidant is further included in the treatment liquid for a semiconductor with ruthenium, the ligand in the present invention also exerts an effect of enhancing stability of the oxidant. In other words, the ligand in the present invention coordinates to a metal impurity in the treatment liquid to thereby decrease the reaction activity of the metal and the oxidant and inhibit decomposition of the oxidant, thereby leading to an improvement of stability of the treatment liquid.

Furthermore, when a wafer including ruthenium is treated, the amount of the metal remaining on the surface of the wafer can also be decreased by utilizing the binding of the ligand and a metal. Such a decrease utilizes that the metal trapped by the ligand included in the treatment liquid for a semiconductor with ruthenium can be stably present in the form of a coordination complex, a chelate or the like in the treatment liquid for a semiconductor with ruthenium.

(Treatment Liquid)

The treatment liquid for a semiconductor with ruthenium of the present invention (hereinafter, also simply referred to as "treatment liquid") is a treatment liquid which can allow treatment of a semiconductor wafer including ruthenium with inhibiting generation of a ruthenium-containing gas such as a $RuO_4$ gas. Thus, the treatment liquid of the present invention is a treatment liquid which can be suitably used in an etching step, a residue removal step, a cleaning step, a CMP step, a treatment step of treating a ruthenium-containing waste liquid, and the like in a semiconductor manufacturing process.

Ruthenium included in a semiconductor wafer to which the treatment liquid of the present invention is to be applied may be formed by any method. A widely known method with respect to a semiconductor manufacturing process, for example, CVD, ALD, sputtering, and/or plating, can be utilized for formation of a film of ruthenium. Such ruthenium may be metallic ruthenium, a ruthenium oxide, an alloy with other metal, an intermetallic compound, an ionic compound, or a coordination complex. Such ruthenium may be exposed on the surface of the wafer, or may be covered with other metal, a metal oxide film, an insulation film, a resist, and/or the like. Even in a case where such ruthenium is covered with other material, the effect of inhibiting generation of a ruthenium-containing gas such as a $RuO_4$ gas is exerted by the ligand included in the treatment liquid of the present invention during contact and dissolution of such ruthenium with and in the treatment liquid. In a case where ruthenium is not to be dissolved intentionally, namely, such ruthenium is to be protected in a treatment, the treatment liquid of the present invention can inhibit a ruthenium-containing gas such as a $RuO_4$ gas generated from very slightly dissolved ruthenium.

The concentration of the ligand in the treatment liquid is preferably 0.0001 to 60% by mass. In case where the amount of the added ligand is too small, not only the interaction with $RuO_4$ or the like is weakened and the effect of inhibiting a $RuO_4$ gas is decreased, but also the amount of $RuO_4$ or the like soluble in the treatment liquid is decreased and thus the number of times the treatment liquid is reused is decreased. On the other hand, in case where the addition amount is too large, the amount of the ligand adsorbed to the ruthenium surface is increased, causing a decrease in rate of ruthenium dissolution and uneven etching of the ruthenium surface. Accordingly, the treatment liquid of the present invention preferably includes the ligand in an amount of 0.0001 to 60% by mass, more preferably 0.01 to 35% by mass, further preferably 0.1 to 20% by mass. The ligand, when added, may be added singly or in combination of two or more kinds thereof. Even in a case where two or more of such ligands are included, generation of a $RuO_4$ gas can be effectively inhibited as long as the total concentration of such ligands falls within the above concentration range.

For example, the treatment liquid of the present invention, when used in a ruthenium wiring formation step, is used as follows. First, a base substrate made of a semiconductor (for example, Si) is prepared. The base substrate prepared is subjected to oxidation, and thus a silicon oxide film is formed on the base substrate. Thereafter, an interlayer insulation film made of a low-dielectric (Low-k) film is formed, and viaholes are formed at predetermined intervals. After viahole formation, ruthenium is embedded in the viaholes by thermal CVD, and a ruthenium film is further formed. The ruthenium film is etched with the treatment liquid of the present invention, and thus flattened with $RuO_4$ gas generation being inhibited. Thus, highly reliable ruthenium wiring with $RuO_2$ particles inhibited can be formed.

A treating system of a semiconductor wafer with the treatment liquid of the present invention is not limited to wet etching, and the treatment liquid can also be suitably utilized as a treatment liquid for a cleaning application or a residue removal application. For example, in the case of use in a cleaning application, wet etching of a wafer including ruthenium with the treatment liquid or the like including an oxidant or the like can be performed and thereafter the wafer can be cleaned with the treatment liquid including the ligand which coordinates to ruthenium in the present invention. The wafer can be cleaned with the treatment liquid including the ligand which coordinates to ruthenium, to thereby change a ruthenium-containing compound generated by wet etching to a ruthenium-coordinated product, resulting in not only inhibition of generation of a $RuO_4$ gas, but also prevention of $RuO_2$ particle generation. The wafer, after cleaned with the treatment liquid including the ligand which coordinates to ruthenium in the present invention, can also be rinsed with water or the like, if desired. The treatment liquid of the present invention, when used in CMP polishing, can inhibit generation of a $RuO_4$ gas also in a CMP polishing step. The treatment of the wafer including ruthenium with the treatment liquid of the present invention may be single wafer treatment or dipping treatment. The treatment liquid of the present invention may be included in an etching liquid for ruthenium, or may be added to a ruthenium-containing solution in order to inhibit a $RuO_4$ gas for the purpose of treating a waste liquid. The temperature of the treatment liquid is not particularly limited, and the effect of inhibiting a $RuO_4$ gas is exerted by the ligand included in the treatment liquid at any treatment temperature.

In the treatment liquid of the present invention, the balance other than the ligand and an organic solvent and other additives described below in detail is water. The water included in the treatment liquid of the present invention is preferably water from which a metal ion, organic impurities, $RuO_2$ particles, and the like are removed by distillation, an ion-exchange treatment, a filter treatment, various adsorption treatments, and the like, and is particularly preferably pure water or ultrapure water. Such water can be obtained by a known method widely utilized in semiconductor manufacturing.

The treatment liquid of the present invention may include an oxidant.

(Oxidant)

The oxidant refers to one having the ability to substantially dissolve ruthenium included in a semiconductor wafer. The oxidant used here can be any oxidant known as an oxidant which can dissolve ruthenium, without any limitation. Examples of the oxidant can include halogen oxyacid, permanganic acid, and salts thereof, hydrogen peroxide, ozone, and a cerium (IV) salt, but are not limited thereto. The halogen oxyacid refers to hypochlorous acid, chlorous acid, chloric acid, perchloric acid, hypobromous acid, bromous acid, bromic acid, perbromic acid, hypoiodous acid, iodous acid, iodic acid, metaperiodic acid, orthoperiodic acid, or an ion thereof. A treatment liquid for a semiconductor wafer, including the oxidant, can dissolve ruthenium included in the wafer, and thus a treatment liquid including the oxidant and the ligand which coordinates to ruthenium can simultaneously dissolve ruthenium and inhibit a $RuO_4$ gas. The treatment liquid contains the oxidant and thus not only dissolution of ruthenium is promoted, but also re-dissolution of $RuO_2$ particles precipitated is promoted. Thus, a treatment liquid containing the ligand and the oxidant can not only inhibit generation of a $RuO_4$ gas and $RuO_2$ particles, but also allow treatment of a ruthenium-containing wafer to be efficiently performed.

The oxidant is preferably halogen oxyacid, a halogen oxyacid ion, or hydrogen peroxide, more preferably hypochlorous acid, hypobromous acid, metaperiodic acid, orthoperiodic acid, or an ion thereof, most preferably hypochlorous acid, hypobromous acid, a hypochlorite ion, or a hypobromite ion, because such an oxidant is alkaline and can be stably used and the concentration range thereof can be widely selected. Such an oxidant may be present in the form of a salt in the treatment liquid, and the salt is preferably, for example, tetraalkylammonium hypochlorite or tetraalkylammonium hypobromite. The carbon number of an alkyl chain of a tetraalkylammonium ion included in such a salt is preferably 1 to 5, and tetramethylammonium hypochlorite or tetramethylammonium hypobromite having one carbon atom is more preferable. The oxidant included in the treatment liquid may be included singly or in combination of two or more kinds thereof.

The method for producing the tetramethylammonium hypochlorite or tetramethylammonium hypobromite is not particularly limited, and one produced by a widely known method can be used. For example, tetramethylammonium hypochlorite or tetramethylammonium hypobromite can be suitably used which is produced by, for example, a method involving blowing chlorine or bromine into tetramethylammonium hydroxide, a method involving mixing hypochlorous acid or hypobromous acid and tetramethylammonium hydroxide, a method involving substituting a cation in a hypochlorite or hypobromite solution with a tetramethyl ion by use of an ion-exchange resin, or a method involving mixing a distilled product of a solution including hypochlorite or hypobromous acid, and tetramethylammonium hydroxide.

In a case where the treatment liquid of the present invention is a treatment liquid including a hypochlorite ion, the range of the concentration of the hypochlorite ion in the entire treatment liquid is preferably 0.05 to 20.0% by mass. The above range can allow for inhibition of a decomposition reaction of the hypochlorite ion in the treatment liquid, inhibition of a decrease in concentration of the hypochlorite ion, and etching of ruthenium at an etching rate of 20 Å/min or more. Thus, the range of the concentration of the hypochlorite ion is preferably 0.1 to 15% by mass, more preferably 0.3 to 10% by mass, further preferably 0.5 to 6% by mass, particularly preferably 0.5 to 4% by mass. In a case where the treatment liquid of the present invention is a treatment liquid including a hypochlorite ion, the hypochlorite ion may be present in the form of hypochlorous acid being a conjugate acid, depending on the pH of the treatment liquid. In such a case, the total concentration of the hypochlorite ion and hypochlorous acid included in the treatment liquid may fall within the concentration range.

In a case where the treatment liquid of the present invention is a treatment liquid including a hypobromite ion, the concentration of the hypobromite ion is not particularly limited as long as it does not depart from the objects of the present invention, and is preferably, 0.01% by mass or more and 1.9% by mass or less. A concentration of less than 0.01% by mass leads to a low etching rate of ruthenium and low practicality. On the other hand, a concentration of more than 1.9% by mass leads to easy decomposition of the hypobromite ion and thus a less stable etching rate of ruthenium. The concentration of the hypobromite ion is more preferably 0.012% by mass or more and 1.9% by mass or less, further preferably 0.048% by mass or more and 1.9% by mass or less, most preferably 0.096% by mass or more and 1.0% by mass or less, in order that etching of ruthenium is stably performed at a sufficient rate. In a case where the treatment liquid of the present invention is a treatment liquid including a hypobromite ion, the hypobromite ion may be present in the form of hypobromous acid being a conjugate acid, depending on the pH of the treatment liquid. In such a case, the total concentration of the hypobromite ion and hypobromous acid included in the treatment liquid may fall within the above concentration range.

In a case where the treatment liquid of the present invention and an inhibitor for the generation of a ruthenium-containing gas described below each include a hypobromite ion, these preferably each further include an oxidant (second oxidant) other than the hypobromite ion. The second oxidant is included in the treatment liquid and the inhibitor for the generation of a ruthenium-containing gas of the present invention, and thus serves to oxidize a bromide ion (Br) generated due to decomposition of the hypobromite ion, into the hypobromite ion again. The treatment liquid and the inhibitor for the generation of a ruthenium-containing gas of the present invention may further include, in addition to the hypobromite ion and the second oxidant, an oxidant different from these oxidants, and the hypobromite ion and the second oxidant can be included and thus an enhancement in stability of the etching rate and further inhibition of the amount of generation of a $RuO_4$ gas can be expected as described below.

When ruthenium is oxidized, the hypobromite ion is reduced to Br. The hypobromite ion is easily decomposed naturally in the treatment liquid, and is partially changed into Br. Decomposition of the hypobromite ion is further promoted by ultraviolet light or visible light, and the hypobromite ion is partially changed into Br. Furthermore, decomposition of the hypobromite ion also progresses due to heating, contact with acid, or contact with metal, and the hypobromite ion is partially changed into Br. Because Br generated by reduction or decomposition of the hypobromite ion does not dissolve ruthenium, reduction or decomposition of the hypobromite ion results in decreases in etching rate of ruthenium and oxidation-reduction potential of the solution. An appropriate second oxidant can be included in the treatment liquid and the inhibitor for the generation of a ruthenium-containing gas to thereby oxidize Br generated by reduction or decomposition into the hypobromite ion, and to slow down the decreases in etching rate of ruthenium and oxidation-reduction potential of the solution. In other words, when the hypobromite ion and an appropriate second oxidant are included in the treatment liquid and the inhibitor for the generation of a ruthenium-containing gas the period during which the etching rate is stable is elongated, and the amount of generation of a $RuO_4$ gas is decreased. The reason for the decrease in amount of generation of a $RuO_4$ gas is because the oxidation-reduction potential of the solution is kept and thus the ligand easily coordinates to the ruthenium-containing compound, as described below.

The second oxidant optionally included in the treatment liquid and the inhibitor for the generation of a ruthenium-containing gas is preferably such that the oxidation-reduction potential between the second oxidant/the chemical species generated by reduction of the second oxidant exceeds the oxidation-reduction potential of the hypobromite ion/Br system. By using the second oxidant, Br can be oxidized into the hypobromite ion. The oxidation-reduction potential between the second oxidant optionally included in the treatment liquid and the inhibitor for the generation of a ruthenium-containing gas/the chemical species generated by reduction of the second oxidant is changed depending on the concentrations of the second oxidant and the chemical species generated by reduction of the second oxidant, the temperature and the pH of the solution, and the like, and the oxidation-reduction potential between the second oxidant/the chemical species generated by reduction of the second oxidant may exceed the oxidation-reduction potential of the hypobromite ion/Br system, regardless of these conditions.

In this regard, the upper limit of the oxidation-reduction potential between the second oxidant optionally included in the treatment liquid and the inhibitor for the generation of a ruthenium-containing gas/the chemical species generated by reduction of the second oxidant is not particularly limited as long as it does not depart from the objects of the present invention. However, in a case where the oxidation-reduction potential is higher than the oxidation-reduction potential (1.0V vs. SHE) of the $RuO_4^-/RuO_4$ system, $RuO_4^-$, $RuO_4^{2-}$, and the like dissolved in the treatment liquid and the inhibitor for the generation of a ruthenium-containing gas can be oxidized into $RuO_4$ by the oxidant to result in increase in $RuO_4$ gas generation. In such a case, oxidation from $RuO_4$ into $RuO_4$ can be inhibited to control the amount of $RuO_4$ gas generation by appropriate adjustments of the amount of the second oxidant added into the treatment liquid and the timing of addition of the second oxidant.

The second oxidant optionally included in the treatment liquid and the inhibitor for the generation of a ruthenium-containing gas of the present invention is preferably a hypochlorite ion because no metal element problematic in semiconductor manufacturing is included and the concentration is easily adjusted due to a high solubility in the solution and stable presence in the solution.

In a case where the treatment liquid and the inhibitor for the generation of a ruthenium-containing gas of the present invention each include a hypobromite ion and a hypochlorite ion, the concentration of the hypochlorite ion is not limited as long as it does not depart from the gist of the present invention, and is preferably 0.05% by mass or more and 20% by mass or less. If the concentration of the hypochlorite ion is less than 0.05% by mass, Br cannot be efficiently oxidized and the etching rate of ruthenium and the oxidation-reduction potential of the solution are decreased. On the other hand, if an amount of addition of the hypochlorite ion is more than 20% by mass, stability of the hypochlorite ion is deteriorated, which is not appropriate. The concentration of the hypochlorite ion is more preferably 0.3% by mass or more and 7% by mass or less, most preferably 0.5% by mass or more and 4% by mass or less, from the viewpoints of the etching rate of ruthenium and inhibition of a $RuO_4$ gas. A preferable range of the concentration of the hypobromite ion in the system where the hypobromite ion and the hypochlorite ion coexist is the same as the range described above. The hypobromite ion or the hypochlorite ion may be respectively present in the form of hypobromous acid or hypochlorous acid being a conjugate acid, depending on the pH of the treatment liquid. In such a case, the total concentration of the hypobromite ion and hypobromous acid included in the treatment liquid and the total concentration of the hypochlorite ion and hypochlorous acid may respectively fall within the above concentration ranges.

(Organic Solvent)

As described above, generation of a $RuO_4$ gas is inhibited in the present invention because $RuO_4$ or the like is retained in the treatment liquid due to coordination of the ligand to $RuO_4$ or the like generated by dissolution of ruthenium. In this case, a precipitate is formed when the amount of the ruthenium-coordinated product exceeds its solubility in the treatment liquid. The precipitate causes $RuO_2$ particles in a semiconductor forming process, thereby leading to a decrease in yield. It is thus important not to generate any precipitate, and the solubility of the ruthenium-coordinated product is preferably increased therefor. Addition of an organic solvent is an effective method for this purpose.

In general, the lower the dielectric constant of a solvent, the easier it is for an electrically neutral chemical species to dissolve. In a case where the ruthenium-coordinated product is electrically neutral, it is more soluble in a solvent with lower dielectric constant. In a case where the ruthenium-coordinated product has any charge, the ruthenium-coordinated product is bulky and thus is low in charge density, and can be more stably present in a solvent with a lower dielectric constant. Accordingly, an organic solvent having a dielectric constant lower than a dielectric constant of water, 78 (Non-Patent Document 1), is desirably added as an organic solvent to be added to the treatment liquid of the present invention, in order to increase the solubility of the ruthenium-coordinated product. The dielectric constant of the treatment liquid can be thus decreased as compared with the case of water only, and the solubility of the ruthenium-coordinated product can be increased and generation of a $RuO_4$ gas can be effectively inhibited. The organic solvent to be added may be any organic solvent as long as it is an organic solvent having lower dielectric constant than water, and is preferably one having a dielectric constant at 25° C. of 45 or less.

Specific examples of the organic solvent include 1,4-dioxane (dielectric constant 2.2), carbon tetrachloride (dielectric constant 2.2), benzene (dielectric constant 2.3), toluene (dielectric constant 2.4), propionic acid (dielectric constant 3.4), trichloroethylene (dielectric constant 3.4), diethyl ether (dielectric constant 4.3), chloroform (dielectric constant 4.9), acetic acid (dielectric constant 6.2), methyl benzoate (dielectric constant 6.6), methyl formate (dielectric constant 8.5), phenol (dielectric constant 9.8), p-cresol (dielectric constant 9.9), isobutyl alcohol (dielectric constant 17.9), acetone (dielectric constant 20.7), nitroethane (dielectric constant 28.1), acetonitrile (dielectric constant 37), ethylene glycol (dielectric constant 37.7), and sulfolane (dielectric constant 43), but, of course, are not limited to these organic solvents. In a case where an organic solvent with low dielectric constant is added, it may be hardly miscible with water. However, even in such a case, the solubility of the ruthenium-coordinated product can be increased by an organic solvent slightly dissolved in water, and addition of such an organic solvent is effective for inhibition of $RuO_4$ gas generation.

In a case where the oxidant is included in the treatment liquid, both the organic solvent and the oxidant are preferably not reacted in order to prevent the decomposition of the organic solvent by the oxidant, and any organic solvent may be used as long as it has low reactivity with the oxidant. For example, in a case where the oxidant is halogen oxyacid or a halogen oxyacid ion, sulfolanes, alkylnitriles, halogenated alkanes, ethers, and the like can be suitably used as the organic solvent to be added to the treatment liquid because of low reactivity with the oxidant. Specific examples of the organic solvent include sulfolane, acetonitrile, carbon tetrachloride, and 1,4-dioxane, but the organic solvent, of course, is not limited thereto.

The organic solvent may be added in an amount necessary for inhibition of production of the precipitate. Thus, the concentration of the organic solvent in the treatment liquid may be 0.1% by mass or more, and the concentration of the organic solvent is preferably 1% by mass or more in order to increase the amount of dissolution of the ruthenium-coordinated product and to retain $RuO_4$ or the like as the ruthenium-coordinated product in the solution. An increased amount of addition of the organic solvent leads to an increased amount of the ruthenium-coordinated product soluble in the treatment liquid, provided that dissolution properties of ruthenium and storage stability of the treatment liquid are not impaired, and thus there are many advantages, for example, not only production of the precipitate can be inhibited, but also, for example, the effect of inhibition of $RuO_4$ gas generation is not deteriorated even in a case where the a small amount of the organic solvent is evaporated, and $RuO_4$ gas generation can be inhibited even when the treatment liquid is reused. The upper limit of the concentration of the organic solvent can be, for example, 30% by mass. The organic solvent to be added may be added singly or in combination of a plurality thereof. Even in a case where a plurality of such organic solvents are added in combination, generation of a $RuO_4$ gas can be inhibited as long as the total concentration of such organic solvents added falls within the above range.

If a solvent with a high volatility is used as the organic solvent, the organic solvent in the treatment liquid is evaporated during treatment of a semiconductor wafer, changing the concentration of the organic solvent and the dielectric constant of the treatment liquid, thereby making stable treatment difficult. The organic solvent is preferably one with low volatility also from the viewpoint of storage stability. Specifically, an organic solvent having a vapor pressure at 20° C. of 50 mmHg or less is preferable, and an organic solvent having a vapor pressure at 20° C. of 20 mmHg or less is more preferable.

The treatment liquid of the present invention preferably has a pH at 25° C. of 7 or more and 14 or less. If the pH of the treatment liquid is less than 7, problems caused are that $RuO_2$ particles easily occur and the amount of generation of a $RuO_4$ gas is increased. In a case where the oxidant included in the treatment liquid is halogen oxyacid or a halogen oxyacid ion, a pH of less than 7 leads to progression of decomposition of the oxidant. On the other hand, a pH of more than 14 is not suitable for the treatment liquid because ruthenium is hardly etched. Accordingly, the pH of the treatment liquid is preferably 7 or more and 14 or less, more preferably more than 7 and 14 or less, further preferably 9 or more and 13 or less in order that the treatment liquid of the present invention sufficiently exhibits the ability to inhibit $RuO_4$ gas generation.

(Other Additives)

Any other additives conventionally used in treatment liquid for a semiconductor may be, if desired, compounded into the treatment liquid of the present invention as long as the objects of the present invention are not impaired. For example, such other additives here added can be, for example, acid, a metal corrosion-preventing agent, a water-soluble organic solvent, a fluorine compound, a reducing agent, a complexing agent, a chelator, a surfactant, a defoamer, a pH adjuster, and/or a stabilizer. Such additives may be added singly or in combinations of a plurality thereof.

The treatment liquid of the present invention may include an alkali metal ion, an alkali earth metal ion, and the like derived from such other additives, depending on production reasons of the treatment liquid, and the like. For example, a sodium ion, a potassium ion and a calcium ion may be included. However, the amount of such alkali metal ion, alkali earth metal ion, and the like are preferably as small as possible and are more preferably not included in fact as possible, because they have an adverse effect on a semiconductor device (an adverse effect such as a decrease in yield of the semiconductor wafer) when remain on a semiconductor wafer. Specifically, the total amount of such alkali metal ion and alkali earth metal ion is preferably 1% by mass or less, more preferably 0.7% by mass or less, further preferably 0.3% by mass or less, particularly preferably 10 ppm or less, most preferably 500 ppb or less. Thus, for example, the pH adjuster is preferably not an inorganic alkali typified by an alkali metal hydroxide such as sodium hydroxide or an alkali earth metal hydroxide such as calcium hydroxide, but an organic alkali such as ammonia, amine, choline or tetraalkylammonium hydroxide.

(Inhibitor for the Generation of a Ruthenium-Containing Gas)

The inhibitor for the generation of a ruthenium-containing gas means one which is to be added to a liquid for treating ruthenium to thereby inhibit generation of a ruthenium-containing gas, and refers to a liquid including the ligand which coordinates to ruthenium.

The liquid for treating ruthenium may be any liquid including a component which is to be contacted with ruthenium to thereby allow the ruthenium to be physically and chemically changed, and is, for example, a solution including an oxidant. Examples of the oxidant can include the oxidants exemplified in the description of the treatment liquid of the present invention. Ruthenium treated with the liquid for treating ruthenium is fully or partially dissolved, dispersed, or precipitated in the treatment liquid, and causes the generation of a $RuO_4$ gas and/or $RuO_2$ particles.

In a liquid including the liquid for treating ruthenium and the inhibitor for the generation of a ruthenium-containing gas of the present invention (also referred to as "gas generation inhibitor-containing treatment liquid"), $RuO_4$ or the like present in the treatment liquid and the ligand form a ruthenium-coordinated product dissolved in the treatment liquid. That reduces formation of $RuO_4$ and $RuO_2$ particles dissolved and existing in the treatment liquid, from $RuO_4$ or the like. This is because not only a $RuO_4$ gas which is generated from $RuO_4$ dissolved and existing in the treatment liquid is significantly decreased, but also generation of $RuO_2$ particles from a $RuO_4$ gas is inhibited.

As described above, the treatment liquid for a semiconductor with ruthenium of the present invention includes the ligand which coordinates to ruthenium, and thus is a treatment liquid which can allow treatment of a semiconductor wafer including ruthenium without generation of a $RuO_4$ gas. In other words, the treatment liquid serves as the liquid for treating ruthenium and also serves as the inhibitor for the generation of a ruthenium-containing gas. Thus, the treatment liquid of the present invention can also be used as the inhibitor for the generation of a ruthenium-containing gas.

The inhibitor for the generation of a ruthenium-containing gas preferably includes an oxidant. By including the oxidant, ruthenium in the solution is easily kept in the form to which the ligand easily coordinates, and therefore the effect of inhibiting a $RuO_4$ gas is enhanced. For example, the inhibitor including the oxidant is added to the liquid for treating ruthenium, in which dissolved ruthenium is easily changed into $RuO_2$ particles during etching of ruthenium. In this case, dissolved ruthenium is easily kept as a ruthenium chemical species to which the ligand more easily coordinates, such as $RuO_4^-$ or $RuO_4$. This is due to the oxidation-reduction potential of the solution being kept high by the oxidant.

Such an oxidant is preferably, for example, any of halogen oxyacid, permanganic acid, and salts thereof, hydrogen peroxide, ozone, and a cerium (IV) salt. The oxidant is preferably halogen oxyacid or a halogen oxyacid ion, more preferably hypochlorous acid, hypobromous acid, metaperiodic acid, orthoperiodic acid, or an ion thereof, most preferably hypochlorous acid, hypobromous acid, a hypochlorite ion, or a hypobromite ion, because such an oxidant can be stably used in an alkaline condition and the concentration range can be widely selected. Such an oxidant may be present in the form of a salt in the treatment liquid, and the salt is preferably, for example, tetraalkylammonium hypochlorite or tetraalkylammonium hypobromite. The carbon number of an alkyl chain of a tetraalkylammonium ion included in such a salt is preferably 1 to 5, and tetramethylammonium hypochlorite or tetramethylammonium hypobromite having one carbon atom is more preferable. The oxidant included in the inhibitor for the generation of a ruthenium-containing gas may be included singly or in combination of two or more kinds thereof.

In a case where the inhibitor for the generation of a ruthenium-containing gas of the present invention includes a hypochlorite ion as the oxidant, the range of the concentration of the hypochlorite ion is preferably 0.05 to 20.0% by mass. The above range can allow inhibition of a decomposition reaction of the hypochlorite ion in the mixed liquid, inhibition of a decrease in the concentration of the hypochlorite ion, and keeping of a ruthenium chemical species to which the ligand easily coordinates. Thus, the range of the concentration of the hypochlorite ion is preferably 0.1 to 15% by mass, more preferably 0.3 to 10% by mass, further preferably 0.5 to 6% by mass, particularly preferably 0.5 to 4% by mass.

In a case where the inhibitor for the generation of a ruthenium-containing gas of the present invention includes a hypobromite ion as the oxidant, the concentration of the hypobromite ion is preferably 0.01% by mass or more and 1.9% by mass or less for the same reason as in the case of the above hypochlorite ion. The concentration of the hypobromite ion is more preferably 0.012% by mass or more and 1.9% by mass or less, further preferably 0.048% by mass or more and 1.9% by mass or less, most preferably 0.096% by mass or more and 1.0% by mass or less.

The inhibitor for the generation of a ruthenium-containing gas of the present invention may include both a hypochlorite ion and a hypobromite ion. In a case where the inhibitor for the generation of a ruthenium-containing gas of the present invention includes a hypochlorite ion and a hypobromite ion in the oxidant, the range of the concentration of the hypochlorite ion is 0.05 to 20.0% by mass for the same reason as in the case of the above treatment liquid. The range of the concentration of the hypobromite ion is preferably 0.01 to 1.9% by mass, more preferably 0.012 to 1.9% by mass, further preferably 0.048 to 1.9% by mass, most preferably 0.096% by mass or more and 1.0% by mass or less for the same reason as in the case of the above treatment liquid. A preferable range of the concentration of the hypobromite ion in the system where both the hypobromite ion and the hypochlorite ion coexist is the same as the range described above. If the ranges of the concentrations of such oxidants fall within the above concentration ranges, it is possible as described above to inhibit a decomposition reaction of a hypohalite ion in a mixed liquid and to keep a form of ruthenium to which the ligand easily coordinates.

The same conditions as those described in the description of the treatment liquid for a semiconductor with ruthenium of the present invention can be applied to conditions in the inhibitor for the generation of a ruthenium-containing gas, for example, the type and the content of the ligand which coordinates to ruthenium, other component and the content thereof, and the pH.

Regarding the other conditions than above, the content of the ligand which coordinates to ruthenium in the inhibitor for the generation of a ruthenium-containing gas can be, for example, 0.0001 to 60% by mass, and is more preferably 0.01 to 35% by mass, further preferably 0.1 to 20% by mass. Such a concentration can be adjusted so that the concentration of the above ligand which coordinates to ruthenium, which is included in the gas generation inhibitor-containing treatment liquid, is a predetermined value, as described below. The same pH adjuster as described above may also be appropriately added to the inhibitor for the generation of a ruthenium-containing gas. The content of the pH adjuster can be adjusted so that the pH of the gas generation inhibitor-containing treatment liquid falls within a predetermined range, as described below. For example, the content of the pH adjuster in the inhibitor for the generation of a ruthenium-containing gas may be any effective amount, and can be, for example, specifically 0.000001 to 10% by mass.

(Method for Inhibiting Generation of Ruthenium-Containing Gas)

The method for inhibiting generation of a ruthenium-containing gas is a method for inhibiting generation of a ruthenium-containing gas, including a step of adding the above inhibitor for the generation of a ruthenium-containing gas to the liquid for treating ruthenium. Specifically, for example, generation of a ruthenium-containing gas can be inhibited by addition of the inhibitor for the generation of a ruthenium-containing gas of the present invention to a liquid (liquid for treating ruthenium) used in ruthenium treating steps in a semiconductor manufacturing process, such as an etching step, a residue removal step, a cleaning step, and a CMP step. Generation of a ruthenium-containing gas can be inhibited by using the inhibitor for the generation of a ruthenium-containing gas, also in cleaning of ruthenium attached to an inner wall of a chamber and a pipe, and the like in each apparatus used in such a semiconductor manufacturing process. For example, generation of a ruthenium-containing gas in cleaning can be inhibited by addition of inhibitor for the generation of a ruthenium-containing gas of the present invention to a cleaning liquid for use in removal of ruthenium attached to a chamber, a pipe arrangement, and the like in maintenance of an apparatus for formation of ruthenium by use of physical vapor deposition (PVD) and chemical vapor deposition (CVD). The method can inhibit generation of a ruthenium-containing gas according to the mechanism indicated in the description of the above inhibitor for the generation of a ruthenium-containing gas.

In the method for inhibiting generation of a ruthenium-containing gas, it is preferable to adjust the concentration of the ligand which coordinates to ruthenium in the inhibitor for the generation of a ruthenium-containing gas and the amount of addition of the inhibitor so that the concentration of at least one of the above ligands which coordinate to ruthenium in the gas generation inhibitor-containing treatment liquid is 0.0001 to 60% by mass. In the method for inhibiting generation of a ruthenium-containing gas, the same pH adjuster as described above may also be appropriately added to the inhibitor for the generation of a ruthenium-containing gas. The content of the pH adjuster in the inhibitor for the generation of a ruthenium-containing gas and the amount of addition of the inhibitor for the generation of a ruthenium-containing gas can be appropriately adjusted so that the pH at 25° C. of the gas generation inhibitor-containing treatment liquid is, for example, 7 to 14.

The amount of addition of the inhibitor for the generation of a ruthenium-containing gas to the liquid for treating ruthenium depends on the amount of ruthenium dissolved in the gas generation inhibitor-containing treatment liquid. The amount of addition of the inhibitor for the generation of a ruthenium-containing gas is not particularly limited, and is, for example, preferably 1 to 10000, more preferably 10 to 5000, further preferably 100 to 2000 on weight basis under the assumption that the amount of ruthenium dissolved in the liquid for treating ruthenium is 1.

(Treatment Agent for a Ruthenium-Containing Waste Liquid)

The treatment agent for a ruthenium-containing waste liquid means one which is to be added to a ruthenium-containing waste liquid to thereby inhibit generation of a ruthenium-containing gas, and refers to a liquid including the ligand which coordinates to ruthenium. Therefore, the treatment liquid for a semiconductor with ruthenium of the present invention can also be used as the treatment agent for a ruthenium-containing waste liquid by utilizing the effect of inhibiting ruthenium-containing gas generation.

The ruthenium-containing waste liquid means a solution including ruthenium even in a slight amount. The ruthenium here is not limited to a ruthenium metal, and may include a ruthenium element, and examples include Ru, $RuO_4^-$, $RuO_4^{2-}$, $RuO_4$, and $RuO_2$. Examples of the ruthenium-containing waste liquid can include a liquid after etching treatment of a semiconductor wafer including ruthenium with an etching liquid having a different composition from that of the treatment liquid of the present invention, and a liquid after treatment with the treatment liquid of the present invention. Examples are not limited to those used for etching of a semiconductor wafer, but also includes a ruthenium-containing liquid generated by a semiconductor manufacturing process, chamber cleaning, and the like, as described with respect to the above method for inhibiting generation of a ruthenium-containing gas.

In a case where ruthenium, even if only slightly, is included in the waste liquid, it undergoes a $RuO_4$ gas and generates $RuO_2$ particles, and thus contaminates a tank and a pipe arrangement and promotes degradation of apparatuses due to the oxidation action of $RuO_2$ particles. A $RuO_4$ gas generated from the waste liquid exhibits a strong toxicity to humans even at a low concentration. Thus, the ruthenium-containing waste liquid has various adverse effects on apparatuses or humans, and is required to be rapidly treated for inhibition of generation of a $RuO_4$ gas.

The same conditions as those described in the description of the treatment liquid for a semiconductor with ruthenium of the present invention can be applied to conditions in the treatment agent for a ruthenium-containing waste liquid of the present invention, for example, the type and the content of the ligand which coordinates to ruthenium, other component and the content thereof, and the pH.

Regarding the other conditions than above, the content of the ligand which coordinates to ruthenium in the treatment agent for a ruthenium-containing waste liquid can be, for example, 0.0001 to 60% by mass, and is more preferably 0.001 to 35% by mass. Such a concentration can be adjusted so that the concentration of the above ligand which coordinates to ruthenium, in a mixed liquid with a ruthenium-containing waste liquid, is a predetermined value, as described below. The same pH adjuster as described above may also be appropriately added to the treatment agent for a ruthenium-containing waste liquid. The content of the pH adjuster can be adjusted so that the pH of the mixed liquid with a ruthenium-containing waste liquid falls within a predetermined range, as described below. For example, the content of the pH adjuster in the treatment agent for a ruthenium-containing waste liquid may be any effective amount, and can be, for example, specifically 0.000001 to 10% by mass.

(Method for Treating Ruthenium-Containing Waste Liquid)

The method for treating a ruthenium-containing waste liquid of the present invention is a method for treating a ruthenium-containing waste liquid, including a step of adding the above treatment agent for a ruthenium-containing waste liquid to a ruthenium-containing waste liquid. The method can inhibit generation of a ruthenium-containing gas from a ruthenium-containing waste liquid, according to the mechanism described with respect to the above inhibitor for the generation of a ruthenium-containing gas. Thus, not only handling of a ruthenium-containing waste liquid is facilitated, but also exhaust facilities and exclusion facilities can be simplified and the cost for treating a ruthenium-containing gas can be saved. Furthermore, the risk of exposure of an operator to a highly toxic ruthenium-containing gas is decreased, and safety is significantly improved.

In the method for treating a ruthenium-containing waste liquid, it is preferable to adjust the concentration of the ligand which coordinates to ruthenium in the treatment agent for a ruthenium-containing waste liquid and the amount of addition of the treatment agent so that the concentration of at least one of the above ligands which coordinate to ruthenium in the mixed liquid of the treatment agent for a ruthenium-containing waste liquid and ruthenium-containing waste liquid is, for example, 0.0001 to 60% by mass. In the method for treating a ruthenium-containing waste liquid, the same pH adjuster as described above may also be appropriately added to the treatment agent for a ruthenium-containing waste liquid. The content of the pH adjuster in the treatment agent for a ruthenium-containing waste liquid and the amount of addition of the treatment agent for a ruthenium-containing waste liquid can be appropriately adjusted so that the pH of the mixed liquid with a ruthenium-containing waste liquid is, for example, 7 to 14.

The amount of addition of the treatment agent for a ruthenium-containing waste liquid to a ruthenium-containing waste liquid depends on the amount of ruthenium in the ruthenium-containing waste liquid. The amount of addition of the treatment agent for a ruthenium-containing waste liquid is not particularly limited, and is, for example, preferably 1 to 10000, more preferably 10 to 5000, further preferably 100 to 2000 on weight basis under the assumption that the amount of ruthenium dissolved in the ruthenium-containing waste liquid is 1.

EXAMPLES

Hereinafter, the present invention will be more specifically described with reference to Examples, but the present invention is not limited to these Examples.
(Production of Treatment Liquid)
Sodium hypochlorite (manufactured by Wako Pure Chemicals Industries, Ltd.), sodium hypobromite (manufactured by Kanto Chemical Co., Inc.) or orthoperiodic acid (FUJIFILM Wako Pure Chemical Corporation), and the ligand and ultrapure water were added into a 100-mL container made of fluororesin, the pH was adjusted with an aqueous HCl or NaOH solution, and thus 60 mL of a treatment liquid having a composition described in Table 1 was obtained.
(Method for Calculating Hypochlorite Ion and Hypobromite Ion Concentrations)
The hypochlorite ion and hypobromite ion concentrations were measured with an ultraviolet-visible spectrophotometer (UV-2600, manufactured by Shimadzu Corporation). Calibration curves were made by using aqueous hypochlorite ion and hypobromite ion solutions of which concentration were respectively known, and the hypochlorite ion and hypobromite ion concentrations in the prepared solutions were determined. The hypochlorite ion and hypobromite ion concentrations were determined from the measurement data of absorption spectra which was stabilized after solution preparation.
(Method for Measuring pH)
10 mL of each treatment liquid prepared in Examples and Comparative Examples was subjected to pH measurement with a table-top PH meter (LAQUA F-73, manufactured by HORIBA Ltd.). The pH measurement was performed after the treatment liquid was prepared and stabilized at 25° C.
(Quantitative Analysis of $RuO_4$ Gas)
The amount of generated $RuO_4$ gas was measured with ICP-OES. 5 mL of the treatment liquid was loaded into a closed container, and one Si wafer of 10×20 mm, on which a ruthenium film having a thickness of 1200 Å was formed, was dipped at 25° C.' until ruthenium was fully dissolved. In Examples 25 and 26, 2.1 mg of tetrapropylammonium perruthenate and 0.4 mg of a $RuO_2$ powder were respectively used instead of the wafer on which a ruthenium film was formed. Thereafter, air was allowed to flow in the closed container, the gas phase in the closed container was bubbled into a container with an absorbing liquid (1 mol/L NaOH), and a $RuO_4$ gas generated during dipping of the Ru wafer was trapped by the absorbing liquid. The amount of ruthenium in the absorbing liquid was measured with ICP-OES, and the amount of ruthenium in the generated $RuO_4$ gas was determined. Whether or not ruthenium on the Si wafer dipped in the treatment liquid was fully dissolved was confirmed by measurement of the respective sheet resistances before and after the dipping with a four-probe resistivity meter (Loresta-GP, manufactured by Mitsubishi Chemical Analytech) and conversion of them into the film thicknesses.

Examples 1 to 29 and Comparative Examples 1 to 6

Table 1 shows the compositions and respective evaluation results of the treatment liquids. In Table 1, the amount of ruthenium is a value obtained by dividing the weight of ruthenium included in the absorbing liquid of a ruthenium-containing gas, by the area of the wafer provided with ruthenium.

TABLE 1

| | Treatment liquid | | | Amount [μg/cm$^2$] of ruthenium in ruthenium-containing gas |
|---|---|---|---|---|
| | Oxidant | Ligand | pH | |
| Example 1 | Aqueous 2.0% NaClO solution | Malonic acid (8.0% by mass) | 7.0 | 4.2 |
| Example 2 | Aqueous 2.0% NaClO solution | Malonic acid (8.0% by mass) | 9.5 | 2.6 |
| Example 3 | Aqueous 2.0% NaClO solution | Malonic acid (4.0% by mass) | 12.0 | 2.2 |
| Example 4 | Aqueous 2.0% NaClO solution | Malonic acid (4.0% by mass) | 13.0 | 0 |
| Example 5 | Aqueous 2.0% NaClO solution | Malonic acid (20% by mass) | 12.0 | 0 |
| Example 6 | Aqueous 2.0% NaClO solution | Succinic acid (5.0% by mass) | 12.0 | 4.8 |
| Example 7 | Aqueous 2.0% NaClO solution | Dimethyl oxalate (4.0% by mass) | 12.0 | 1.0 |
| Example 8 | Aqueous 2.0% NaClO solution | Citric acid (4.0% by mass) | 12.0 | 4.0 |
| Example 9 | Aqueous 2.0% NaClO solution | Glutaric acid (8.0% by mass) | 12.0 | 1.3 |
| Example 10 | Aqueous 2.0% NaClO solution | Diglycolic acid (8.0% by mass) | 12.0 | 2.8 |
| Example 11 | Aqueous 2.0% NaClO solution | Butane-1,2,3,4-tetracarboxylic acid (8.0% by mass) | 12.0 | 1.9 |
| Example 12 | Aqueous 2.0% NaClO solution | 1,2,3,4,5,6-Cyclohexanehexacarboxylic acid (0.1% by mass) | 12.0 | 10.3 |
| Example 13 | Aqueous 2.0% NaClO solution | 1,2,3,4,5,6-Cyclohexanehexacarboxylic acid (4.0% by mass) | 12.0 | 0.3 |
| Example 14 | Aqueous 2.0% NaClO solution | Acetic acid (8.0% by mass) | 12.0 | 4.0 |
| Example 15 | Aqueous 2.0% NaClO solution | Oxalic acid (8.0% by mass) | 12.0 | 4.6 |
| Example 16 | Aqueous 2.0% NaClO solution | 1,3-Adamantane dicarboxylic acid (4.0% by mass) | 12.0 | 1.6 |
| Example 17 | Aqueous 2.0% NaClO solution | 2,2-Bis(hydroxymethyl)propionic acid (4.0% by mass) | 12.0 | 0.1 |

TABLE 1-continued

| | Treatment liquid | | | Amount [μg/cm$^2$] of ruthenium in ruthenium-containing gas |
|---|---|---|---|---|
| | Oxidant | Ligand | pH | |
| Example 18 | Aqueous 2.0% NaClO solution | Dimethylmalonic acid (8.0% by mass) | 12.0 | 3.8 |
| Example 19 | Aqueous 0.01% NaBrO solution | Malonic acid (4.0% by mass) | 12.0 | 1.2 |
| Example 20 | Aqueous 0.5% NaBrO solution | Malonic acid (4.0% by mass) | 12.0 | 1.3 |
| Example 21 | Aqueous 2.0% NaBrO solution | Malonic acid (4.0% by mass) | 12.0 | 1.5 |
| Example 22 | Aqueous 6.0% NaBrO solution | Malonic acid (4.0% by mass) | 12.0 | 2.2 |
| Example 23 | Aqueous 1.0% orthoperiodic acid solution | Malonic acid (7.0% by mass) | 11.0 | 2.2 |
| Example 24 | Aqueous 2.0% NaClO solution + Aqueous 0.5% NaBrO solution | Malonic acid (4.0% by mass) | 12.0 | 0.8 |
| Example 25 | — | Malonic acid (4.0% by mass) | 12.0 | 0.2 |
| Example 26 | — | Malonic acid (4.0% by mass) | 12.0 | 0.3 |
| Example 27 | Aqueous 2.0% NaClO solution | Pyridine (4.0% by mass) | 12.0 | 2.1 |
| Example 28 | Aqueous 2.0% NaClO solution | Benzotriazole (4.0% by mass) | 12.0 | 2.7 |
| Example 29 | Aqueous 2.0% NaClO solution | Imidazole (4.0% by mass) | 12.0 | 3.1 |
| Comparative Example 1 | Aqueous 2.0% NaClO solution | None | 7.0 | 58 |
| Comparative Example 2 | Aqueous 2.0% NaClO solution | None | 9.5 | 40 |
| Comparative Example 3 | Aqueous 2.0% NaClO solution | None | 12.0 | 18.9 |
| Comparative Example 4 | Aqueous 2.0% NaClO solution | Sodium thiocyanate (4.0% by mass) | 12.0 | 19.1 |
| Comparative Example 5 | Aqueous 2.0% NaClO solution | Sodium chloride (4.0% by mass) | 12.0 | 18.7 |
| Comparative Example 6 | Aqueous 1.0% orthoperiodic acid solution | None | 11.0 | 31.0 |

It can be seen from comparison of Examples 3 and 5 to 18 with Comparative Examples 3 to 5, in which the pH were the same, that the amount of generation of a RuO$_4$ gas could be decreased by addition of the ligand which coordinates to ruthenium. On the other hand, it can be seen from comparison of Comparative Example 4 (ligand: SCN$^-$) and Comparative Example 5 (ligand: Cl$^-$), in which ligands which do not coordinate to any ruthenium-containing compound were added, with Comparative Example 3 in which no ligand was added, that the amount of generation of a RuO$_4$ gas was not changed. It was thus found that a ligand which does not coordinate to ruthenium (Ru), such as SCN$^-$ or Cl$^-$, has no effect of inhibiting generation of a RuO$_4$ gas and the ligand which coordinates to a ruthenium-containing compound (RuO$_4$ or the like), as indicated in Examples 1 to 29, was required to be added in order to inhibit RuO$_4$ gas generation.

It can be seen from comparison of Examples 1 to 3 with Comparative Examples 1 to 3 that the amount of generation of a RuO$_4$ gas could be decreased by addition of the ligand at any pH. In Example 4, when a treatment liquid to which the ligand was added at a pH of 13 was used, the amount of ruthenium was 0 μg/cm$^2$.

It can be seen from comparison of Examples 3 and 5 with Comparative Example 3 that the amount of generation of a RuO$_4$ gas could be further decreased by addition of the ligand at a high concentration.

It can be seen from comparison of Examples 12 and 13 with Comparative Example 3 that the amount of generation of a RuO$_4$ gas could be decreased even in the case of addition of a trace amount of the ligand.

It can be seen from comparison of Examples 3 and 19 to 24 with Comparative Examples 3 and 6 that the amount of generation of a RuO$_4$ gas could be decreased by addition of the ligand, regardless of the type of the oxidant.

Even in Examples 25 and 26 where no oxidant was included in the treatment liquid, generation of a ruthenium-containing gas was inhibited.

Even in Examples 27 to 29 where a heterocyclic compound containing nitrogen was used as the ligand which coordinates to ruthenium, generation of a ruthenium-containing gas was inhibited.

Examples 30 to 58 and Comparative Examples 7 to 12

(Preparation of Mixed Liquid of Liquid for Treating Ruthenium and Inhibitor for the Generation of a Ruthenium-Containing Gas)

First, sodium hypochlorite (manufactured by Wako Pure Chemicals Industries, Ltd.) and ultrapure water were added to a 100-mL container made of fluororesin and the pH was adjusted with an aqueous HCl or NaOH solution, and thus 30 mL of a liquid for treating ruthenium, having a composition described in Table 2, was obtained. Next, the ligand and ultrapure water were added to a 100-mL container made of fluororesin and then the pH was adjusted as described in Table 2, in the same manner as described above, and thus 30 mL of an inhibitor for the generation of a ruthenium-containing gas was obtained. The obtained liquid for treating ruthenium and the obtained inhibitor for the generation of a ruthenium-containing gas were mixed to provide 60 mL of mixed liquid. In Comparative Examples 7 to 12, 30 mL of ultrapure water whose pH was adjusted to the same as that of the liquid for treating ruthenium was mixed instead of the inhibitor for the generation of a ruthenium-containing gas. The oxidant concentration and the pH in each of the liquids were evaluated according to the same methods as in Examples 1 to 29.

(Quantitative Analysis of RuO$_4$ Gas)

Each of the obtained mixed liquids was used, and quantitative analysis of a RuO$_4$ gas was performed according to the same method as in Examples 1 to 29. In Examples 54 and 55, 2.1 mg of tetrapropylammonium perruthenate and 0.4 mg of a RuO$_2$ powder were respectively used instead of the wafer on which a ruthenium film was formed.

TABLE 2

| | Liquid for treating ruthenium | | Inhibitor for generation of ruthenium-containing gas | | Amount [μg/cm$^2$] of ruthenium in ruthenium-containing gas |
|---|---|---|---|---|---|
| | Oxidant | pH | Ligand | pH | |
| Example 30 | Aqueous 4.0% NaClO solution | 7.0 | Malonic acid (16.0% by mass) | 7.0 | 4.0 |
| Example 31 | Aqueous 4.0% NaClO solution | 9.5 | Malonic acid (16.0% by mass) | 9.5 | 2.6 |
| Example 32 | Aqueous 4.0% NaClO solution | 12.0 | Malonic acid (8.0% by mass) | 12.0 | 2.6 |
| Example 33 | Aqueous 4.0% NaClO solution | 13.0 | Malonic acid (8.0% by mass) | 13.0 | 0 |
| Example 34 | Aqueous 4.0% NaClO solution | 12.0 | Malonic acid (40% by mass) | 12.0 | 0 |
| Example 35 | Aqueous 4.0% NaClO solution | 12.0 | Succinic acid (10.0% by mass) | 12.0 | 4.1 |
| Example 36 | Aqueous 4.0% NaClO solution | 12.0 | Dimethyl oxalate (8.0% by mass) | 12.0 | 1.8 |
| Example 37 | Aqueous 4.0% NaClO solution | 12.0 | Citric acid (8.0% by mass) | 12.0 | 4.3 |
| Example 38 | Aqueous 4.0% NaClO solution | 12.0 | Glutaric acid (18.0% by mass) | 12.0 | 1.2 |
| Example 39 | Aqueous 4.0% NaClO solution | 12.0 | Diglycolic acid (16.0% by mass) | 12.0 | 2.4 |
| Example 40 | Aqueous 4.0% NaClO solution | 12.0 | Butane-1,2,3,4-tetracarboxylic acid (8.0% by mass) | 12.0 | 1.7 |
| Example 41 | Aqueous 4.0% NaClO solution | 12.0 | 1,2,3,4,5,6-Cyclohexanehexacarboxylic acid (0.2% by mass) | 12.0 | 10.0 |
| Example 42 | Aqueous 4.0% NaClO solution | 12.0 | 1,2,3,4,5,6-Cyclohexanehexacarboxylic acid (8.0% by mass) | 12.0 | 0.5 |
| Example 43 | Aqueous 4.0% NaClO solution | 12.0 | Acetic acid (16.0% by mass) | 12.0 | 4.1 |
| Example 44 | Aqueous 4.0% NaClO solution | 12.0 | Oxalic acid (16.0% by mass) | 12.0 | 4.1 |
| Example 45 | Aqueous 4.0% NaClO solution | 12.0 | 1,3-Adamantane dicarboxylic acid (8.0% by mass) | 12.0 | 1.3 |
| Example 46 | Aqueous 4.0% NaClO solution | 12.0 | 2,2-Bis(hydroxymethyl)propionic acid (8.0% by mass) | 12.0 | 0.3 |
| Example 47 | Aqueous 4.0% NaClO solution | 12.0 | Dimethylmalonic acid (16.0% by mass) | 12.0 | 3.4 |
| Example 48 | Aqueous 0.02% NaBrO solution | 12.0 | Malonic acid (8.0% by mass) | 12.0 | 1.7 |
| Example 49 | Aqueous 1.0% NaBrO solution | 12.0 | Malonic acid (8.0% by mass) | 12.0 | 1.8 |
| Example 50 | Aqueous 4.0% NaBrO solution | 12.0 | Malonic acid (8.0% by mass) | 12.0 | 1.4 |
| Example 51 | Aqueous 12.0% NaBrO solution | 12.0 | Malonic acid (8.0% by mass) | 12.0 | 2.7 |
| Example 52 | Aqueous 2.0% orthoperiodic acid solution | 11.0 | Malonic acid (14.0% by mass) | 11.0 | 2.5 |
| Example 53 | Aqueous 4.0% NaClO solution + Aqueous 1.0% NaBrO solution | 12.0 | Malonic acid (8.0% by mass) | 12.0 | 0.5 |
| Example 54 | — | | Malonic acid (4.0% by mass) | 12.0 | 2.7 |
| Example 55 | — | | Malonic acid (4.0% by mass) | 12.0 | 1.7 |
| Example 56 | Aqueous 2.0% NaClO solution | 12.0 | Pyridine (4.0% by mass) | 12.0 | 3.2 |
| Example 57 | Aqueous 2.0% NaClO solution | 12.0 | Benzotriazole (4.0% by mass) | 12.0 | 3.0 |
| Example 58 | Aqueous 2.0% NaClO solution | 12.0 | Imidazole (4.0% by mass) | 12.0 | 3.7 |
| Comparative Example 7 | Aqueous 4.0% NaClO solution | 7.0 | None | 7.0 | 58 |
| Comparative Example 8 | Aqueous 4.0% NaClO solution | 9.5 | None | 9.5 | 40 |
| Comparative Example 9 | Aqueous 4.0% NaClO solution | 12.0 | None | 12.0 | 18.9 |
| Comparative Example 10 | Aqueous 4.0% NaClO solution | 12.0 | Sodium thiocyanate (8.0% by mass) | 12.0 | 19.1 |
| Comparative Example 11 | Aqueous 4.0% NaClO solution | 12.0 | Sodium chloride (8.0% by mass) | 12.0 | 18.7 |
| Comparative Example 12 | Aqueous 2.0% orthoperiodic acid solution | 11.0 | None | 11.0 | 31.0 |

It has been found as shown in Table 2 that generation of a ruthenium-containing gas can be inhibited by addition of the inhibitor for the generation of a ruthenium-containing gas of the present invention to the liquid for treating ruthenium.

Examples 59 to 73

(Preparation of Mixed Liquid of Ruthenium-Containing Waste Liquid and Treatment Agent for a Ruthenium-Containing Waste Liquid)

Sodium hypochlorite (manufactured by Wako Pure Chemicals Industries, Ltd.) and ultrapure water were added to a container made of fluororesin and then the pH was adjusted as described in Table 3, with an aqueous HCl or NaOH solution, and thus each treatment liquid for etching of ruthenium, including 2.0% by mass of sodium hypochlorite, was obtained. A 300-mm Si wafer on which a ruthenium film having a thickness of 1360 Å was formed was dipped in 1 L of the obtained treatment liquid until ruthenium was fully dissolved, and thereafter a ruthenium-containing waste liquid was recovered in a waste liquid tank.

Next, sodium hypochlorite (manufactured by Wako Pure Chemicals Industries, Ltd.), the ligand and ultrapure water were added to a container made of fluororesin and then the pH was adjusted as described in Table 3, with an aqueous HCl or NaOH solution, and thus each treatment agent for a ruthenium-containing waste liquid described in Table 3 was obtained. In Examples 72 and 73, no sodium hypochlorite was added (oxidant-free). 1 L of the obtained treatment agent for a ruthenium-containing waste liquid was mixed at 25° C. in a waste liquid tank, and thereby each mixed liquid of the ruthenium-containing waste liquid and the treatment agent for a ruthenium-containing waste liquid (hereinafter, also simply referred to as "mixed liquid"), including $6.0 \times 10^{-4}$ mol/L of ruthenium, described in Table 3 was obtained.

(Quantitative Analysis of $RuO_4$ Gas)

The amount of generation of a $RuO_4$ gas was measured by using the obtained mixed liquid, according to the same method as in Example 1.

Example 74

A treatment liquid for etching of ruthenium, including 4.0% by mass of sodium hypochlorite, was obtained according to the same method as in Example 59. 1 L of the obtained treatment liquid was allowed to flow at 25° C. for 10 minutes onto a surface of a 300-mm Si wafer on which a ruthenium film having a thickness of 2720 Å was formed, the surface was rinsed with 1 L of ultrapure water, and thereafter a ruthenium-containing waste liquid was recovered in a waste liquid tank. Next, 2 L of the treatment agent for a ruthenium-containing waste liquid obtained according to the same method as in Example 59, described in Table 3, was mixed into the waste liquid tank, and thereby a mixed liquid of the ruthenium-containing waste liquid and the treatment agent for a ruthenium-containing waste liquid, including $6.0 \times 10^{-4}$ mol/L of ruthenium, described in Table 3, was obtained. The quantitative analysis of a $RuO_4$ gas was performed according the same procedure as in Example 59.

Comparative Examples 13 to 15

Sodium hypochlorite (manufactured by Wako Pure Chemicals Industries, Ltd.) and ultrapure water were added to a container made of fluororesin and then the pH was adjusted as described in Table 4 with an aqueous HCl or NaOH solution, and each treatment liquid for etching of ruthenium, including 2.0% by mass of sodium hypochlorite, was obtained. A 300-mm Si wafer on which a ruthenium film having a thickness of 680 Å was formed was dipped in 1 L of the obtained treatment liquid at 25° C. for 10 minutes, thereafter the liquid was recovered in a waste liquid tank, and thereby a ruthenium-containing waste liquid including $6.0 \times 10^{-4}$ mol/L of Ru, described in Table 4, was obtained. The quantitative analysis of a $RuO_4$ gas was performed according the same procedure as in Example 59.

Comparative Example 16

A treatment liquid for etching of ruthenium, including 4.0% by mass of sodium hypochlorite, was obtained according to the same method as in Example 59. 1 L of the obtained treatment liquid was allowed to flow at 25° C. for 10 minutes onto a surface of a 300-mm Si wafer on which a ruthenium film having a thickness of 1360 Å was formed, the surface was rinsed with 1 L of ultrapure water and then the liquid was recovered in a waste liquid tank, and thereby a ruthenium-containing waste liquid including $6.0 \times 10^{-4}$ mol/L of Ru, described in Table 4, was obtained. The quantitative analysis of a $RuO_4$ gas was performed according the same procedure as in Example 59.

TABLE 3

| | Treatment agent for ruthenium-containing waste liquid | | | Concentration [mol/L] of ruthenium in | Wafer treatment | Amount [µg/cm²] of ruthenium in |
|---|---|---|---|---|---|---|
| | Oxidant | Ligand | pH | mixed liquid | method | $RuO_4$ gas |
| Example 59 | Aqueous 2.0% by mass NaClO solution | Malonic acid (16.0% by mass) | 7.0 | $6.0 \times 10^{-4}$ | Dipping | 3.8 |
| Example 60 | Aqueous 2.0% by mass NaClO solution | Malonic acid (16.0% by mass) | 9.0 | $6.0 \times 10^{-4}$ | Dipping | 2.3 |
| Example 61 | Aqueous 2.0% by mass NaClO solution | Malonic acid (8.0% by mass) | 12.0 | $6.0 \times 10^{-4}$ | Dipping | 2.5 |
| Example 62 | Aqueous 2.0% by mass NaClO solution | Malonic acid (8.0% by mass) | 13.0 | $6.0 \times 10^{-4}$ | Dipping | 0.2 |
| Example 63 | Aqueous 2.0% by mass NaClO solution | Dimethyl oxalate (6.0% by mass) | 12.0 | $6.0 \times 10^{-4}$ | Dipping | 3.7 |
| Example 64 | Aqueous 2.0% by mass NaClO solution | Citric acid (8.0% by mass) | 12.0 | $6.0 \times 10^{-4}$ | Dipping | 3.5 |
| Example 65 | Aqueous 2.0% by mass NaClO solution | Diglycolic acid (13.0% by mass) | 12.0 | $6.0 \times 10^{-4}$ | Dipping | 5.0 |
| Example 66 | Aqueous 2.0% by mass NaClO solution | Butane-1,2,3,4-tetracarboxylic acid (13.0% by mass) | 12.0 | $6.0 \times 10^{-4}$ | Dipping | 2.5 |
| Example 67 | Aqueous 2.0% by mass NaClO solution | 1,2,3,4,5,6-Cyclohexanehexa-carboxylic acid (4.0% by mass) | 12.0 | $6.0 \times 10^{-4}$ | Dipping | 2.7 |
| Example 68 | Aqueous 2.0% by mass NaClO solution | 1,3-Adamantane dicarboxylic acid (4.0% by mass) | 12.0 | $6.0 \times 10^{-4}$ | Dipping | 3.2 |
| Example 69 | Aqueous 2.0% by mass NaClO solution | Dimethylmalonic acid (8.0% by mass) | 12.0 | $6.0 \times 10^{-4}$ | Dipping | 5.4 |
| Example 70 | Aqueous 2.0% by mass NaClO solution | Pyridine (4.0% by mass) | 12.0 | $6.0 \times 10^{-4}$ | Dipping | 3.6 |
| Example 71 | Aqueous 2.0% by mass NaClO solution | Benzotriazole (4.0% by mass) | 12.0 | $6.0 \times 10^{-4}$ | Dipping | 2.7 |
| Example 72 | — | Malonic acid (8.0% by mass) | 12.0 | $6.0 \times 10^{-4}$ | Dipping | 2.7 |
| Example 73 | — | Dimethyl oxalate (6.0% by mass) | 12.0 | $6.0 \times 10^{-4}$ | Dipping | 3.5 |
| Example 74 | Aqueous 2.0% by mass NaClO solution | Malonic acid (8.0% by mass) | 12.0 | $6.0 \times 10^{-4}$ | Single wafer | 2.6 |

TABLE 4

| | Composition of treatment liquid for etching of ruthenium | | | Concentration [mol/L] of ruthenium in ruthenium-containing waste liquid | Wafer treatment method | Amount [μg/cm²] of ruthenium in RuO₄ gas |
|---|---|---|---|---|---|---|
| | Oxidant | Ligand | pH | | | |
| Comparative Example 13 | Aqueous 2.0% by mass NaClO solution | — | 7.0 | $6.0 \times 10^{-4}$ | Dipping | 59 |
| Comparative Example 14 | Aqueous 2.0% by mass NaClO solution | — | 9.0 | $6.0 \times 10^{-4}$ | Dipping | 37 |
| Comparative Example 15 | Aqueous 2.0% by mass NaClO solution | — | 12.0 | $6.0 \times 10^{-4}$ | Dipping | 19 |
| Comparative Example 16 | Aqueous 4.0% by mass NaClO solution | — | 12.0 | $6.0 \times 10^{-4}$ | Single wafer | 17 |

It has been found from the results in Tables 3 and 4 that, in a case where the treatment agent for a ruthenium-containing waste liquid including the ligand is added to the ruthenium-containing waste liquid, generation of a ruthenium-containing gas is inhibited. Thus, the treatment agent for a ruthenium-containing waste liquid of the present invention, if used for treatment of ruthenium-containing waste liquid, inhibits generation of a ruthenium-containing gas, and thus can be suitably used for treatment of ruthenium-containing waste liquid.

Examples 75 to 77 and Comparative Examples 17 and 18

Each treatment liquid described in Table 5 was obtained according to the same procedure as in Example 1. The obtained treatment liquid was stored at 60° C., and the hypochlorite ion and hypobromite ion concentrations after 5, 20, 40, and 60 hours were measured according to the same method as in Example 1. The oxidant concentration after 0 hours (immediately after production of the treatment liquid) was defined as 100%, and the oxidant concentration at each measurement time was summarized in Table 5.

TABLE 5

| | Treatment liquid | | | Temporal change [%] in oxidant concentration | | | | |
|---|---|---|---|---|---|---|---|---|
| | Oxidant | Ligand | pH | 0 h | 5 h | 20 h | 40 h | 60 h |
| Example 75 | Aqueous 2.0% NaClO solution | Malonic acid (4.0% by mass) | 12.0 | 100 | 100 | 99 | 98 | 97 |
| Example 76 | Aqueous 2.0% NaClO solution | Citric acid (4.0% by mass) | 12.0 | 100 | 99 | 98 | 97 | 95 |
| Example 77 | Aqueous 0.01% NaBrO solution | Malonic acid (4.0% by mass) | 12.0 | 100 | 99 | 94 | 88 | 80 |
| Comparative Example 17 | Aqueous 2.0% NaClO solution | None | 12.0 | 100 | 99 | 94 | 89 | 84 |
| Comparative Example 18 | Aqueous 0.01% NaBrO solution | None | 12.0 | 100 | 97 | 90 | 80 | 70 |

It has been found from the results in Table 5 that, in a case where a hypochlorite ion or hypobromite ion is included as the oxidant, the treatment liquid including the ligand in the present invention is more favorable in stability of the treatment liquid.

What is claimed is:

1. A treatment liquid for a semiconductor with ruthenium, comprising a ligand which coordinates to ruthenium and an oxidant, wherein
    the oxidant is a hypobromite ion,
    a concentration of the hypobromite ion is 0.01 to 1.9% by mass,
    the ligand which coordinates to ruthenium is a compound having a carbonyl group, and
    a concentration of the ligand which coordinates to ruthenium is 0.01 to 35% by mass.

2. The treatment liquid for a semiconductor with ruthenium according to claim 1, wherein the ligand which coordinates to ruthenium is at least one selected from the group consisting of ligands represented by the following formulae (1) to (4):

$$R_1-CO-R_2 \quad (1)$$

wherein $R_1$ and $R_2$ are each independently a hydrocarbon group having carbon number of 1 to 10, optionally containing a hydroxyl group or/and an ether bond, or a hydroxyl group;

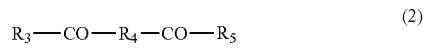

$$R_3-CO-R_4-CO-R_5 \quad (2)$$

wherein $R_3$ and $R_5$ are each independently a hydrocarbon group having carbon number of 1 to 10, optionally containing a hydroxyl group or/and an ether bond, or a hydroxyl group, and $R_4$ is a hydrocarbon group having carbon number of 1 to 10, optionally containing a hydroxyl group or/and an ether bond;

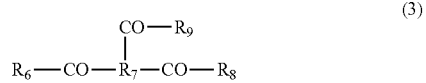

$$R_6-CO-R_7(-CO-R_9)-CO-R_8 \quad (3)$$

wherein $R_6$, $R_8$, and $R_9$ are each independently a hydrocarbon group having carbon number of 1 to 10, optionally containing a hydroxyl group or/and an ether bond, or a hydroxyl group, and $R_7$ is a hydrocarbon group having carbon number of 1 to 10, optionally containing a hydroxyl group or/and an ether bond;

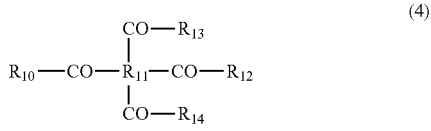

wherein $R_{10}$ and $R_{12\ to\ 14}$ are each independently a hydrocarbon group having carbon number of 1 to 10, optionally containing a hydroxyl group or/and an ether bond, or a hydroxyl group, and $R_{11}$ is a hydrocarbon group having carbon number of 1 to 10, optionally containing a hydroxyl group or/and an ether bond.

3. The treatment liquid for a semiconductor with ruthenium according to claim 1, wherein the ligand which coordinates to ruthenium is a ligand represented by the following formula (5):

wherein $R_{15}$ and $R_{16}$ are each independently a hydrocarbon group having carbon number of 1 to 10, optionally containing a hydroxyl group or/and an ether bond, or a hydroxyl group.

4. The treatment liquid for a semiconductor with ruthenium according to claim 2, wherein the compound having a carbonyl group is oxalic acid, dimethyl oxalate, 1,2,3,4,5,6-cyclohexanehexacarboxylic acid, succinic acid, acetic acid, butane-1,2,3,4-tetracarboxylic acid, dimethylmalonic acid, glutaric acid, diglycolic acid, citric acid, malonic acid, 1,3-adamantane dicarboxylic acid, or 2,2-bis(hydroxymethyl)propionic acid.

5. The treatment liquid for a semiconductor with ruthenium according to claim 1, having a pH at 25° C. of 7 or more and 14 or less.

6. The treatment liquid for a semiconductor with ruthenium according to claim 1, wherein the concentration of the hypobromite ion is 0.012 to 1.9% by mass.

7. A method for treating a ruthenium-containing wafer with the treatment liquid according to claim 1, comprising contacting the ruthenium-containing wafer with the treatment liquid.

* * * * *